US008653904B2

(12) United States Patent
Endo

(10) Patent No.: US 8,653,904 B2

(45) Date of Patent: Feb. 18, 2014

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 311 days.

(21) Appl. No.: 13/165,064

(22) Filed: Jun. 21, 2011

(65) Prior Publication Data

US 2011/0316643 A1 Dec. 29, 2011

(30) Foreign Application Priority Data

Jun. 25, 2010 (JP) ................................ 2010-145097
Jul. 29, 2010 (JP) ................................ 2010-170435

(51) Int. Cl.
*H03H 7/42* (2006.01)
*H01P 3/08* (2006.01)

(52) U.S. Cl.
USPC ........................................ 333/25; 333/238

(58) Field of Classification Search
USPC ........................................ 333/25, 26, 238
See application file for complete search history.

(56) References Cited

U.S. PATENT DOCUMENTS 5,497,137 A 3/1996 Fujiki
6,819,199 B2 * 11/2004 Burns et al. .................... 333/26
7,629,860 B2 * 12/2009 Liu et al. ........................ 333/25
7,948,331 B2 5/2011 Endo
8,085,111 B2 * 12/2011 Endo ............................ 333/26
8,143,968 B2 3/2012 Endo
8,203,396 B2 * 6/2012 Endo ............................ 333/26
8,212,630 B2 * 7/2012 Endo ............................ 333/26
8,319,577 B2 * 11/2012 Endo ............................ 333/25
2003/0102937 A1 6/2003 Hiroshima et al.
2004/0164817 A1 8/2004 Nosaka
2009/0237176 A1 9/2009 Endo
2010/0045401 A1 2/2010 Endo
2010/0109792 A1 5/2010 Endo

FOREIGN PATENT DOCUMENTS

CN 1269618 A 10/2000
CN 1523705 A 8/2004
JP A-7-176918 7/1995
JP A-2002-271111 9/2002
JP A-2009-260288 11/2009
JP A-2010-50621 3/2010
JP A-2010-109871 5/2010

* cited by examiner

*Primary Examiner* — Dean O Takaoka
(74) *Attorney, Agent, or Firm* — Oliff PLC

(57) ABSTRACT

A thin film balun of the present invention comprises: an unbalanced transmission line UL including a first line portion L1 and a second line portion L2; a balanced transmission line BL including a third line portion L3 and a fourth line portion L4 that are positioned facing the first line portion L1 and the second line portion L2 and electromagnetically coupled to the first line portion L1 and the second line portion L2, respectively; an unbalanced terminal UT connected to an end of the first line portion L1; a first balanced terminal BT1 connected to the third line portion L3; a second balanced terminal BT2 connected to the fourth line portion L4; and a ground terminal G connected to the third line portion L3 and the fourth line portion L4, wherein the ground terminal G has an extension that extends from the ground terminal G to an area at the unbalanced terminal UT side.

8 Claims, 38 Drawing Sheets

THIN FILM BALUN

CROSS-REFERENCES TO RELATED APPLICATIONS

The present application claims priority to prior filed Japanese Patent applications No. 2010-145097, filed on Jun. 25, 2010 and No. 2010-170435, filed on Jul. 29, 2010, the entire contents of which are hereby incorporated by reference.

FIELD OF THE INVENTION

The present invention relates to a balun (balun transformer) that performs conversion between unbalanced and balanced signals, in particular to a thin film balun that is formed by a thin film process advantageous for smaller and thinner models.

BACKGROUND OF THE INVENTION

A wireless communication device comprises various high frequency elements such as an antenna, a filter, an RF switch, a power amplifier, an RF-IC and a balun. Of these elements, a resonant element such as an antenna or a filter handles (transmits) an unbalanced signal which is based on a ground potential, whereas an RF-IC which generates or processes a high frequency signal handles (transmits) a balanced signal. Accordingly, when electromagnetically connecting these two elements, a balun that functions as an unbalanced-balanced converter is used.

Recently, there is a demand for smaller and thinner baluns for use in wireless LAN devices, mobile communication devices such as a mobile phone and a portable terminal in order to meet the needs for miniaturization of these devices. As one of such thin film baluns, for example, Patent Document 1 proposes a chip-type balun having a coil lamination structure.

[Patent Document 1] Japanese laid-open publication No. 07-176918 (JP7-176918A)

However, in the configuration of a chip-type balun disclosed in the above patent document 1, a desired balanced characteristic cannot be sufficiently obtained in a signal frequency that is to be converted while maintaining miniaturization of the balun, and there is a problem in that the characteristic of the balun is insufficient as a balun for high frequency used in mobile phones, etc.

SUMMARY

The present invention has been made in light of the circumstances above, and it is an object of the present invention to provide a thin film balun that is capable of maintaining miniaturization and improving balanced characteristics.

In order to solve the above-mentioned problem, the thin balun of the present invention comprises: an unbalanced transmission line including a first line portion and a second line portion; a balanced transmission line including a third line portion and a fourth line portion that are positioned facing the first line portion and the second line portion and electromagnetically coupled to the first line portion and the second line portion, respectively; an unbalanced terminal connected to an end of the first line portion; a first balanced terminal connected to the third line portion; a second balanced terminal connected to the fourth line portion; and a ground terminal connected to the third line portion and the fourth line portion, wherein the ground terminal has an extension that extends from the ground terminal to an area at the unbalanced terminal side. That is, in the configuration of a thin film balun according to the present invention, the first line portion is connected to the unbalanced terminal at its one end and to the second line portion at its other end, the third line portion is connected to a first balanced terminal at its one end and to the ground terminal at its other end, the fourth line portion is connected to a second balanced terminal at its one end and to the ground terminal at its other end, and a part of the ground terminal projects towards the unbalance terminal side.

In this configuration, the ground terminal has an extension that extends from the ground terminal to an area at the unbalanced terminal side, and this causes remarkable improvements in balanced characteristics, particularly, in amplitude balance (amplitude difference) characteristics of a thin film balun to be found by the present inventor.

The above extension may be formed in art area excluding the area facing at least one of the unbalanced transmission line and the balanced transmission line. Remarkable improvements in amplitude balance characteristics have been found by the present inventor also in this configuration. Considering this point, it is possible to maintain excellent amplitude balance characteristics and adjust phase balance (phase difference) characteristics by appropriately adjusting the position of the extension.

Additionally, the third line portion and the fourth line portion may be formed in a first layer, and a connection electrically connecting the third line portion and the fourth line portion and the extension connected to the connection may be formed in a second layer. The connection and the extension may be connected to each other by a lead conductor, and the lead conductor may be positioned closer to the unbalanced terminal than the ground terminal. Remarkable improvements in amplitude balance characteristics have also been found by the present inventor in this configuration.

Additionally, the extension may be formed in a layer that is the same as the layer in which the third line portion and the fourth line portion are formed or the layer in which the first line portion and the second line portion are formed. Remarkable improvements in the phase balance characteristics described above have also been found by the present inventor in this configuration, without limiting the layer in which the extension is formed.

In the structure of a chip-type balun disclosed in the above patent document 1, if its miniaturization is simply performed, the inductance value may change due to the change in length of the transmission line, causing various characteristics of the balun to vary.

In order to overcome this disadvantage and further improve the characteristics such as insertion loss (passage) characteristics while maintaining various desired characteristics of the balun, it is preferable that the third line portion and the fourth line portion are formed in the same layer and that the third line portion and the fourth line portion are electrically connected via an L component in a different layer. That is, the configuration may have the third line portion and the fourth line portion formed in the same layer to be led, respectively, to a different layer via an insulating layer and further connected to each other by an L component.

if the balun is configured as described above, the impedance of a circuit is changed and the impedance matching is improved by providing an L component between the third line portion and the fourth line portion. It has been found that this causes the electrical characteristics of the thin film balun to be improved.

A coil may be preferably used as the above line portion. In this case, the thin film balun of the present invention comprises: an unbalanced transmission line including a first coil portion (first line portion) and a second coil portion (second line portion); a balanced transmission line including a third coil portion (third line portion) and a fourth coil portion (fourth line portion) that are positioned facing the first coil portion and the second coil portion and magnetically coupled to the first coil portion and the second coil portion, respectively; an unbalanced terminal connected to an end of the first coil portion; a first balanced terminal connected to the third coil portion; a second balanced terminal connected to the fourth coil portion; and a ground terminal connected to the third coil portion and the fourth coil portion, wherein the third coil portion and the fourth coil portion are formed in the same layer, and the third coil portion and the fourth coil portion are electrically connected via an L component in a different layer.

The above L component may be a connecting conductor that electrically connects the third line portion and the fourth line portion and may have a curved portion at a part thereof. More specifically, it is preferable to use, as the L component, a coil that is formed to cancel the magnetic field in the balanced transmission line.

At least a part of the above L component may be positioned at an area facing an opening of a coil conductor of at least one of the third coil portion and the fourth coil portion. Improvements in electrical characteristics of the thin film balun have been found by the present inventor also in this configuration. Therefore, by appropriately adjusting the position of the L component, a thin film balun with excellent electrical characteristics may be realized.

Additionally, the first coil portion and the second coil portion are electrically connected via a connecting conductor in a layer in which the third coil component and the fourth coil component are electrically connected via an L component, and the connecting conductor and the conductor of a part of the L component may be positioned in parallel or substantially parallel. It has been found that the electrical characteristics are advantageously improved also in such a configuration.

More specifically, the L component may be positioned between the ground terminal and the fourth coil portion.

EFFECT OF THE INVENTION

According to the present invention, by configuring such that the ground terminal has an extension that extends from the ground terminal to an area at the unbalanced terminal side, a thin film balun with excellent balanced characteristics while maintaining miniaturization may be obtained. In addition, by providing an L component between the third line portion and the fourth line portion described above in the thin film balun, the impedance of the circuit is changed and the impedance matching characteristic is improved, and as a result, the electrical characteristics of the thin film balun can be remarkably improved.

DETAILED DESCRIPTION OF PREFERRED EMBODIMENTS

Figure 1:
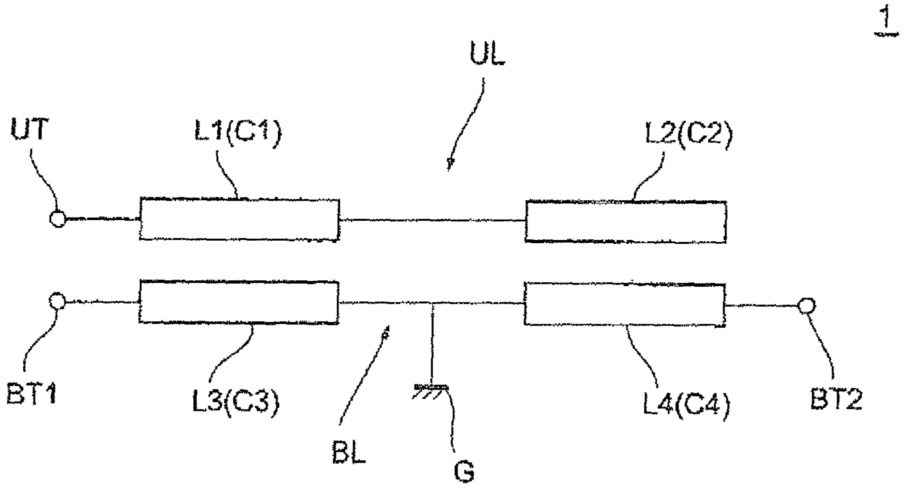
FIG. 1 is an equivalent circuit diagram showing a configuration of an embodiment of a thin film balun of the present invention.

The following describes embodiments (examples) of the present invention with reference to the drawings. Note that the same elements in the drawings are given the same reference numerals, and repeated description is omitted. Moreover, the positional relationships such as top, bottom, left and right are based on the positional relationships shown in the drawings, unless otherwise specified. Furthermore, scale ratios of the drawings are not limited to the illustrated ratios. Note also that the following embodiments are merely examples for describing the present invention, and the present invention is not limited to the embodiments. Various modifications can be made without departing from the scope of the present invention.

FIG. 1 is an equivalent circuit diagram showing a configuration of a thin film balun according to a preferred embodiment of the present invention. As shown in FIG. 1, a thin film balun 1 comprises an unbalanced transmission line (unbalanced circuit) UL in which a line portion L1 (first line portion) and a line portion L2 (second line portion) are connected in series, and a balanced transmission line (balanced circuit) BL in which a line portion L3 (third line portion) and a line portion L4 (fourth line portion) are connected in series. The line portions L1 and L3 form electromagnetic coupling, and the line portions L2 and L4 form electromagnetic coupling.

In the thin film balun 1, an end of the line portion L1 other than the end connected to the line portion L2 is connected to an unbalanced terminal UT, and an end of the line portion L2 other than the end connected to the line portion L1 is an open end. Ends of the line portion L3 and the line portion L4 other than the ends connected to each other are connected to a balanced terminal (first balanced terminal) BT1 and a balanced terminal (second balanced terminal) BT2. Moreover, the connected ends of the line portions L3 and L4 are grounded to the same potential as a ground terminal (ground terminal electrode) G.

Lengths of the above-mentioned line portions L1 to L4 vary depending on specifications of the thin film balun 1. For example, the lengths may be set so as to form a quarter-wavelength ($\lambda/4$) resonator circuit of a transmission signal which is subject to conversion. Moreover, shapes of the line portions L1 to L4 do not have particular limitations as long as the above-mentioned electromagnetic coupling is formed and may be arbitrarily shaped. Examples of the shapes include forms such as spiral (coil form), meadering, straight line and curved line.

A basic operation of the thin film balm 1 is described below with reference to the same figure. In the thin film balun 1, when an unbalanced signal is input to the unbalanced terminal UT, the unbalanced signal propagates through the line portions L1 and L2. By the electromagnetic coupling (first electromagnetic coupling) of the line portions L1 and L3 and the electromagnetic coupling (second electromagnetic coupling) of the line portions L2 and L4, the input unbalanced signal is converted to two balanced signals that have the same frequency as the unbalanced signal and differ in phase by 180° ($\pi$), and the two balanced signals are output from the balanced terminals BT1 and BT2, respectively. A converting operation from balanced signals to an unbalanced signal is the reverse of the above-mentioned converting operation from an unbalanced signal to balanced signals.

Figure 2:
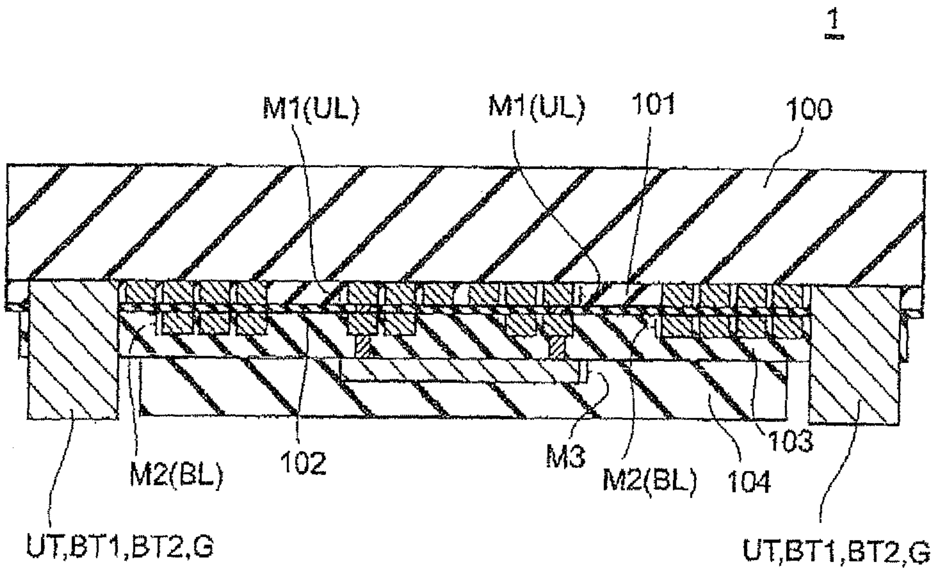
FIG. 2 is a vertical sectional view showing a configuration of an embodiment of a thin film balun.

Next, an example of a wiring structure of the thin film balun 1 is described below. FIG. 2 is a vertical sectional view schematically showing the wiring structure of the thin film balun 1. As shown in FIG. 2, in the thin film balun 1, for example, wiring layers M1, M2 and M3 are formed in this order on an insulating substrate 100 of alumina or the like.

The unbalanced transmission line UL is formed by the wiring layer M1 and is plated with a metal conductor such as copper (Cu), etc. In order to ensure flatness between the wirings of the unbalanced transmission line UL, alumina or the like is embedded therebetween by a sputtering method to form an insulating layer 101. An interlayer insulating film 102 that determines the center frequency of the thin film balun 1 is formed between the wiring layer M1 and the wiring layer M2, and this interlayer insulating film 102 is formed by CVD (Chemical Vapor Deposition) method using silicon nitride (SiN).

Additionally, the balanced transmission line BL is formed by the wiring layer M2 and is plated with a metal conductor such as copper (Cu), etc. An insulating layer 103 is formed between the wirings of the balanced transmission line BL and between the wiring layer M2 and the wiring layer M3. The insulating layer 103 is formed by covering and patterning the polyimide over the wiring layer M2 by a photolithographic method. Moreover, a through hole (opening) that is in communication with the wiring layer M3 is formed in the insulating layer 103. A connection wiring (connecting conductor) that connects the wirings to each other in the unbalanced transmission line UL and the balanced transmission line BL is formed by the wiring layer M3, and the connection wiring is also plated with a metal conductor such as copper (Cu), etc.

An insulating layer 104 is formed as a protective film on the wiring layer M3, and the insulating layer 104 is made of polyimide. The unbalanced terminal UT, the balanced terminals BT1 and BT2 and the ground terminal G are formed so as to pass through the insulating layer. In this way, the thin film balun 1 includes a thin film multilayer structure that is formed on the insulating substrate 100. Note that the materials of each insulating layer described above are not limited to the above, and not only inorganic insulators such as silicon nitride, alumina and silica but also organic insulators such as polyimide and epoxy resin may be appropriately selected. The method for manufacturing each layer (manufacturing method) is not limited to the above.

Example 1

A pattern of each of the wiring layers M1, M2 and M3 in an example of the thin film balun of the present embodiment is described in detail below. Coil portions C1 to C4 are used as the line portions L1 to L4 in the following example.

Figure 3:
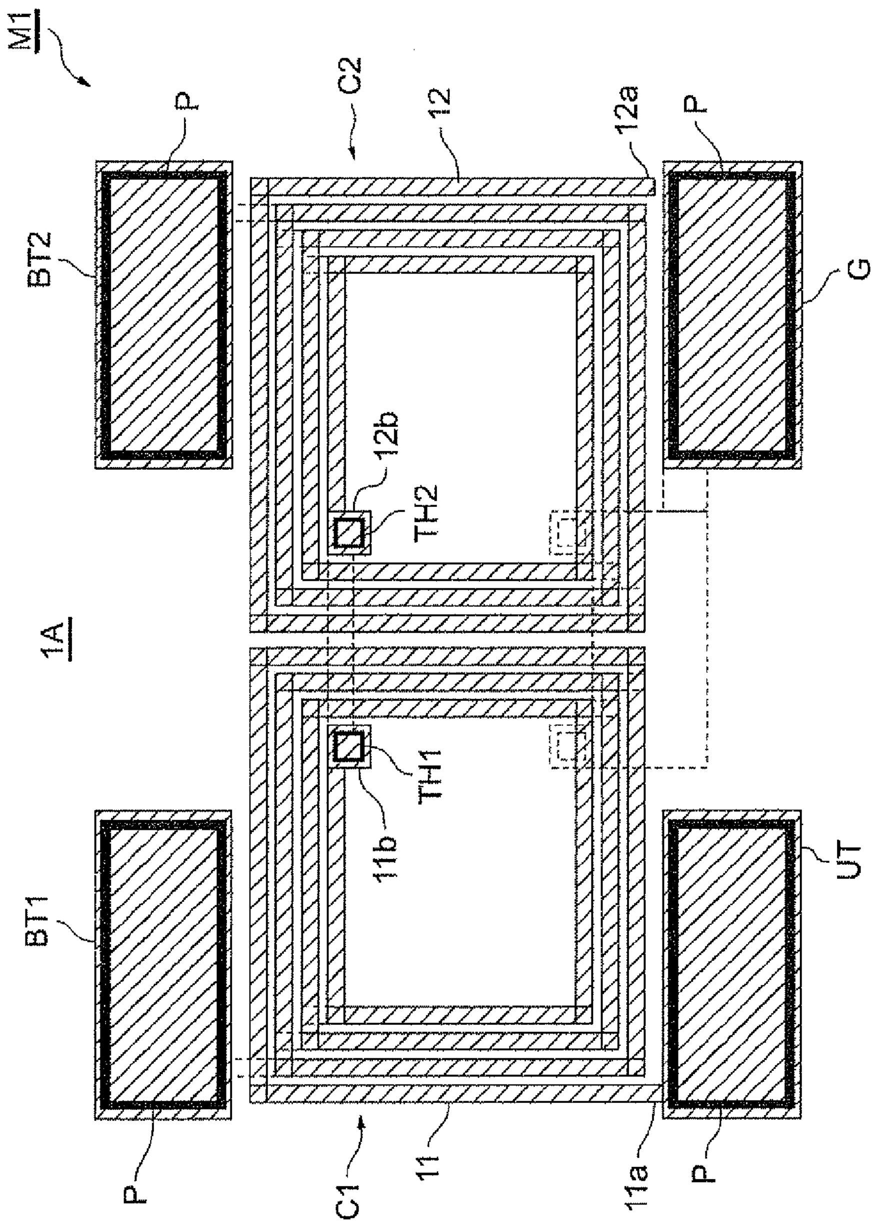
FIG. 3 is a horizontal sectional view in a wiring layer M1 of a thin film balun 1A of Example 1.
Figure 4:
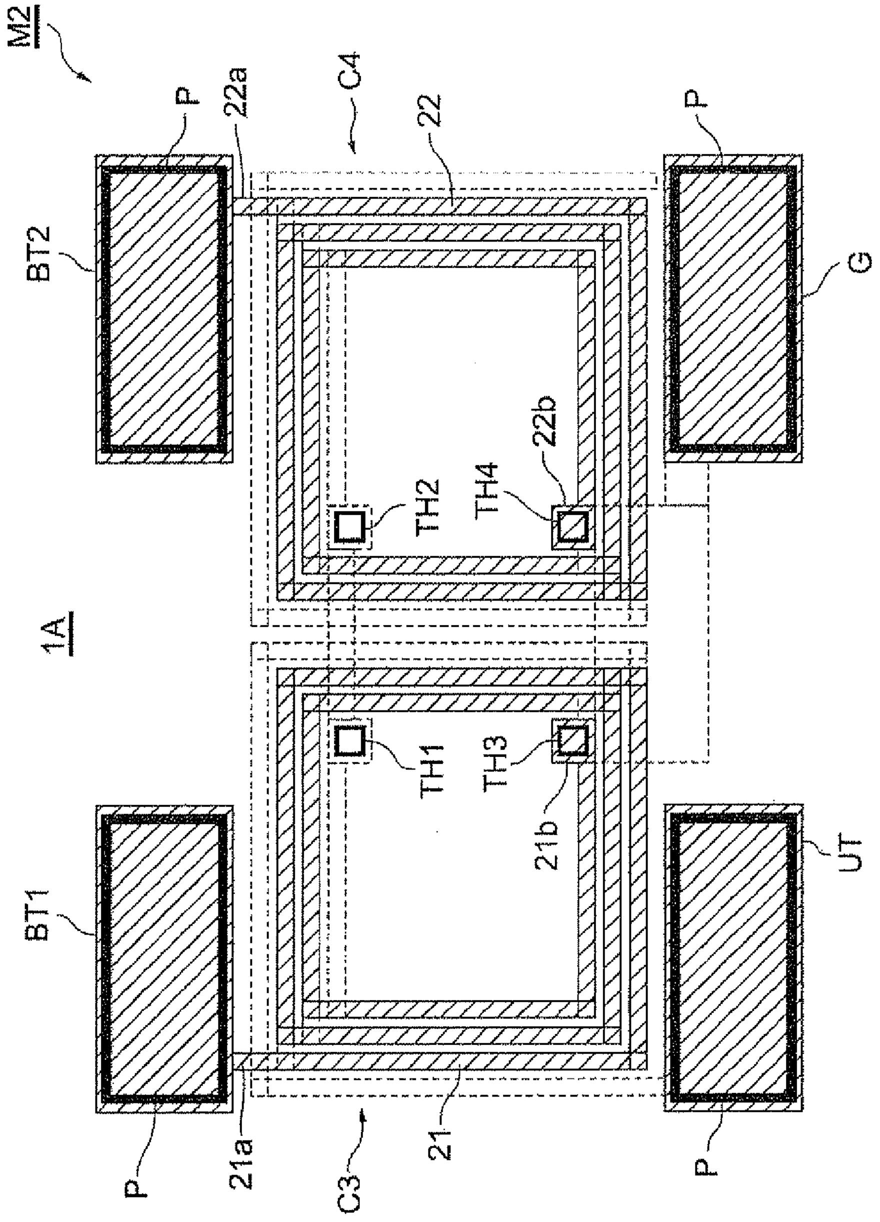
FIG. 4 is a horizontal sectional view in a wiring layer M2 of a thin film balun 1A of Example 1.
Figure 5:
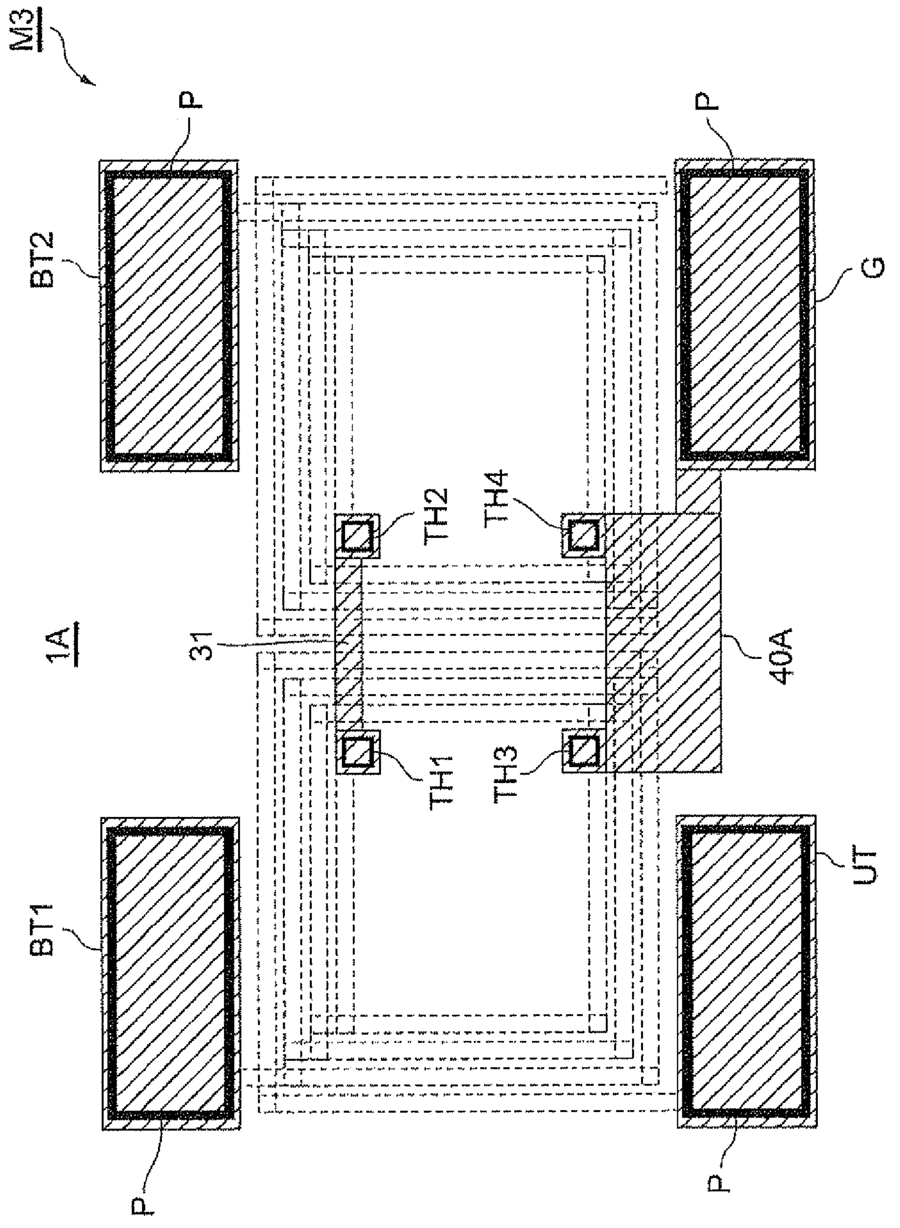
FIG. 5 is a horizontal sectional view in a wiring layer M3 of a thin film balun 1A of Example 1.

FIGS. 3 to 5 are horizontal sectional views schematically showing each wiring layer in the thin film balun 1A of Example 1 of the present invention. As shown in FIGS. 3 to 5, the unbalanced terminal UT, the balanced terminals BT1 and BT2 and the ground terminal G are formed in all of the wiring layers M1 to M3, and each of the terminals UT, BT1, BT2 and G is electrically connected between different layers via a through hole P. Through holes TH1 to TH4 shown in FIGS. 3 to 5 are plated with a metal conductor for electrical conduction of upper and lower layers. A configuration of each of the wiring layers M1 to M3 is further described below.

As shown in FIG. 3, a coil portion C1 (first line portion) and the coil portion C2 (second line portion) that constitute the unbalanced transmission line UL are formed adjacent to each other in the wiring layer M1. Specifically, the unbalanced transmission line UL is constituted by two bilateral coil portions (spiral coils). Each of the coil portions C1 and C2 constitutes an equivalent of a quarter-wavelength (λ/4) resonator. These coil portions C1 and C2 are positioned facing the coil portions C3 and C4 of the balanced transmission line BL respectively, and the facing portions are electromagnetically coupled to form couplers.

In the wiring layer M1, an outer end 11*a* of the coil conductor 11 that constitutes the coil portion C1 is connected to the unbalanced terminal UT and an inner end 11*b* of the coil conductor 11 is connected to the through hole TH1. On the other hand, an inner end 12*b* of the coil conductor 12 that constitutes the coil portion C2 is connected to the through hole TH2, and an outer end 12*a* of the coil conductor 12 is an open end and is open near the ground terminal G. The coil conductors 11 and 12 are connected to each other via a wiring 31 of the wiring layer M3 shown in FIG. 5. Note, however, that there is no limitation to the widths and the number of turns of the coil conductors 11 and 12, and the widths and the number of turns of the coil conductors 11 and 12 may be equal or different.

As shown in FIG. 4, the coil portion C3 (third line portion) and the coil portion C4 (fourth line portion) that constitute the balanced transmission line BL are formed adjacent to each other in the wiring layer M2. Specifically, the balanced transmission line BL is constituted by two bilateral coil portions (spiral coils). Each of the coil portions C3 and C4 constitutes an equivalent of a quarter-wavelength (λ/4) resonator.

In the wiring layer M2, the outer end 21*a* of the coil conductor 21 that constitutes the coil portion C3 is connected to the balanced terminal BT1 and the inner end 21*b* of the coil conductor 21 is connected to the through hole TH3. On the other hand, the outer end 22*a* of the coil conductor 22 that constitutes the coil portion C4 is connected to the balanced terminal BT2, and the inner end 22*b* of the coil conductor 22 is connected to the through hole TH4. The coil conductors 21 and 22 are connected to each other via a GND electrode 40A of the wiring layer M3 shown in FIG. 5, thereby connected to the ground terminal G.

As shown in FIG. 5, a wiring (connection) 31 for connecting the coil portions C1 and C2 of the unbalanced transmission line UL via two through holes TH1 and TH2 and a GND electrode 40A for electrically connecting the coil portions C3 and C4 of the balanced transmission line BL to the ground terminal G via two through holes TH3 and TH4 are formed in the wiring layer M3.

The GND electrode 40A is an extension of the ground terminal G that extends from the ground terminal G to an area near the unbalanced terminal UT, and as shown in FIG. 5, the GND electrode 40A is connected to the coil conductors 21 and 22 and the ground terminal G via the through holes TH3 and TH4. That is, the ground terminal G is formed such that a part thereof projects towards the unbalance terminal side UT. The GND electrode 40A is formed at a position including at least the area facing a part of the coil portions C3 and C4 that constitutes the wiring layer M2. That is, the GND electrode 40A is positioned so as to overlap with the coil conductors of the coil portions C3 and C4.

In this way, in the present example, a thin film balun 1A forming the equivalent circuit shown in FIG. 1 is constituted by a multilayer wiring structure in which the two coil portions C1 and C2 constituting the unbalanced transmission line UL are formed in the wiring layer M1 which is one layer, the two coil portions C3 and C4 constituting the balanced transmission line BL are formed in the wiring layer M2 which is another layer adjacent to the wiring layer M1, and a wiring 31 connecting the coil portions C1 and C2 and the GND electrode 40A connecting the coil portions C3 and C4 and the ground terminal G are formed in the wiring layer M3 which is another layer adjacent to the wiring layer M2 on the opposite side to the wiring layer M1.

As will be described later, the present inventor has found that, according to the configuration of such thin film balun 1A, both the miniaturization/thinning and remarkable improvements in electrical characteristics, particularly, in amplitude balance characteristics can be attained due to the change in the electromagnetic coupling state.

Although details of this function are still unclear, it is assumed that improvements in electrical characteristics, particularly, the amplitude balance characteristics are attained by forming a capacitance component between the GND electrode and the unbalanced electrode, causing art influence on the characteristic impedance. Note, however, that the function is not limited to such.

Example 2

Figure 6:
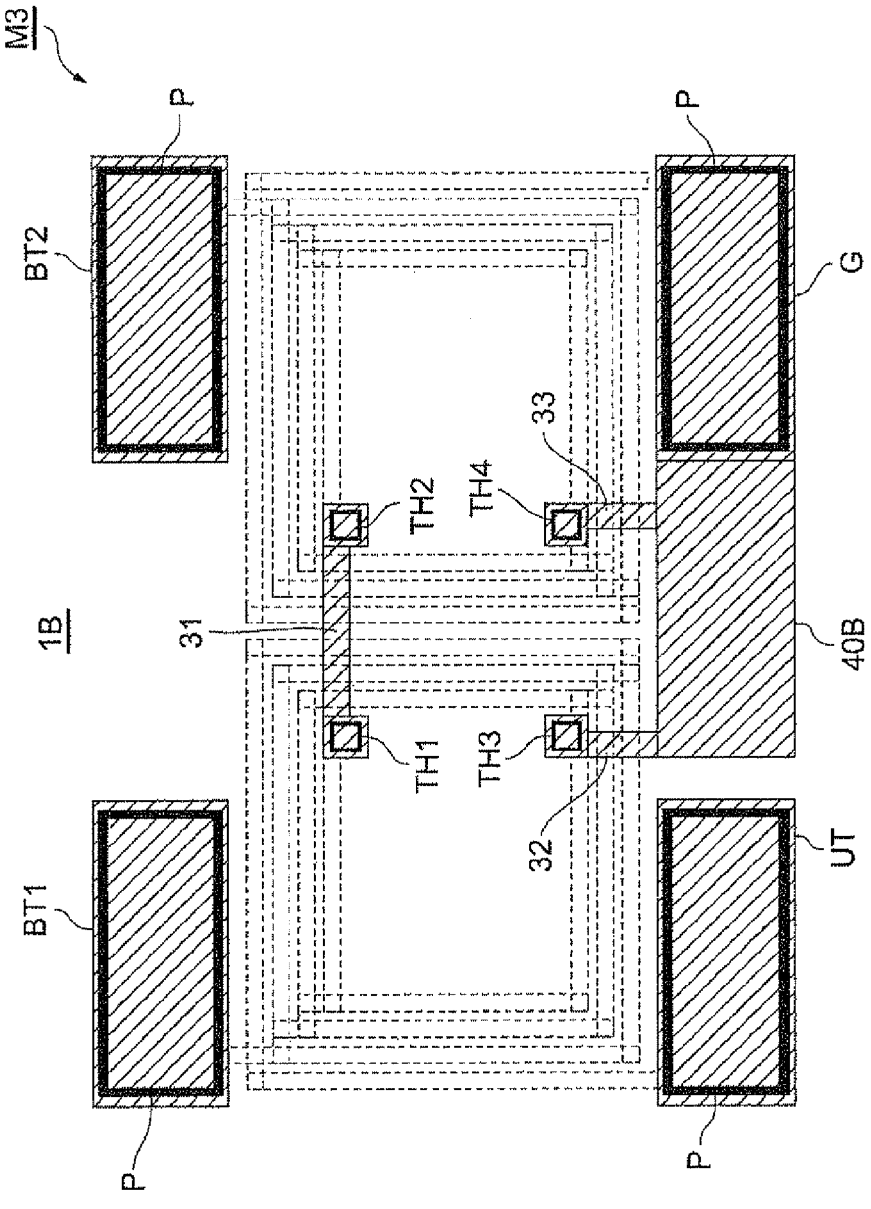
FIG. 6 is a horizontal sectional view in a wiring layer M3 of a thin film balun 1B of Example 2.

FIG. 6 is a horizontal sectional view schematically showing the wiring layer M3 in the thin film balun 1B of Example 2 of the present invention. The configuration other than that of the wiring layer M3 is the same as Example 1. As shown in FIG. 6, in contrast to the GND electrode 40A of Example 1, the GND electrode 40B of the thin film balun 1B is formed at a position that excludes the area facing the coil portions C3 and C4 that constitute the balanced transmission line BL. That is, the GND electrode 40B is formed at an area which does not overlap with the coil portions C3 and C4. The GND electrode 40B extends from the ground terminal G to an area near the unbalanced terminal UT and is electrically connected to each of the wirings (lead conductors) 32 and 33 of the coil portions C3 and C4 via the through holes TH3 and TH4 of the wiring layer M3.

Example 3

Figure 7:
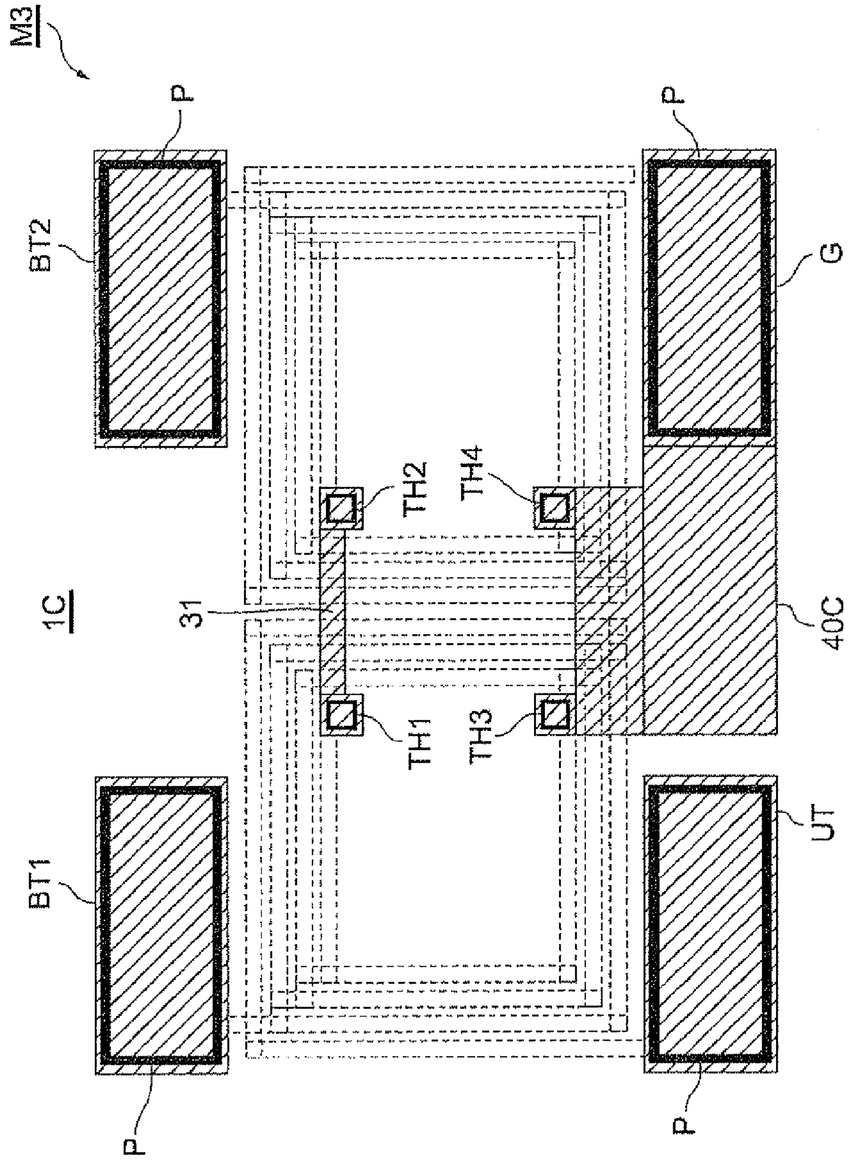
FIG. 7 is a horizontal sectional view in a wiring layer M3 of a thin film balun 1C of Example 3.

FIG. 7 is a horizontal sectional view schematically showing the wiring layer M3 in the thin film balun 1C of Example 3 of the present invention. The configuration other than that of the wiring layer M3 is same as Example 1. As shown in FIG. 7, in contrast to the GND electrode 40A of the thin film balun 1A, the GND electrode 40C of the thin film balun 1C is formed at a position of the area facing each part of the coil portions C3 and C4 that constitute the wiring layer M2. The area of the GND electrode 40C is greater than the area of the GND electrode 40A.

Reference Example 1

Figure 8:
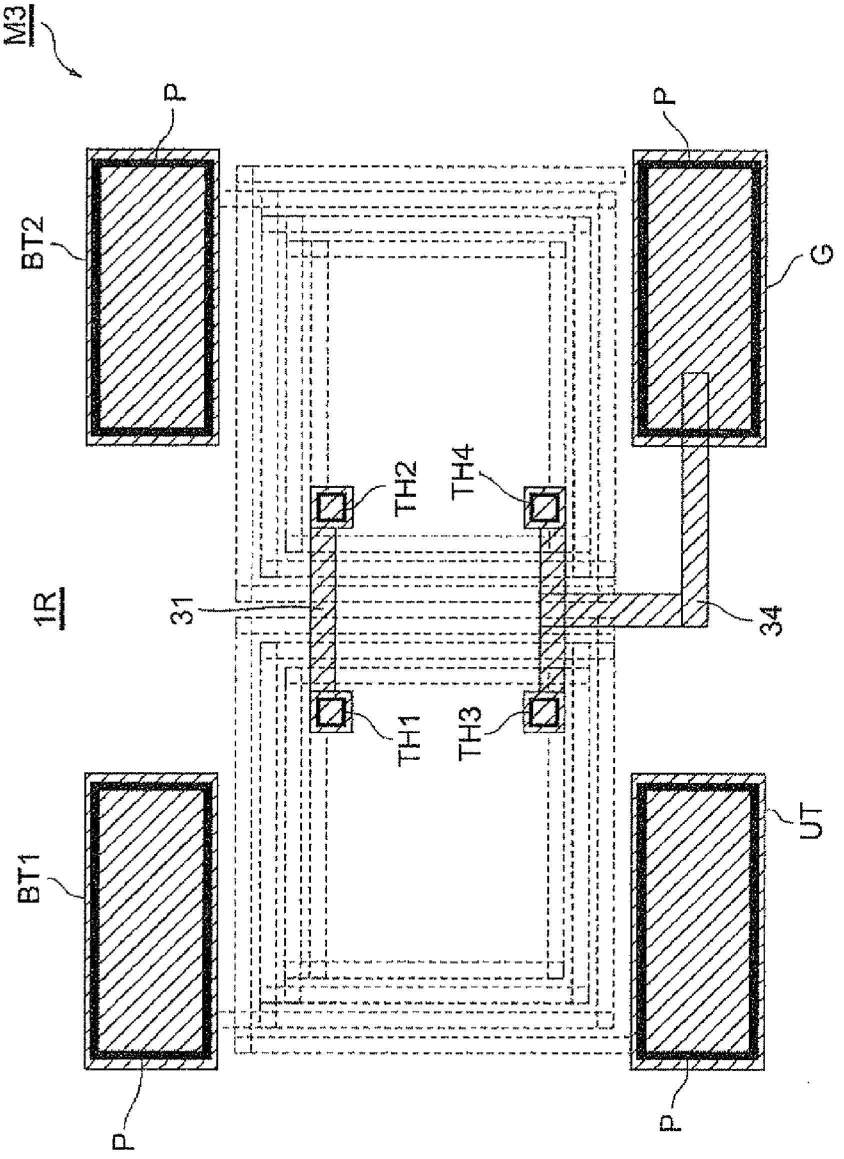
FIG. 8 is a horizontal sectional view in a wiring layer M3 of a thin film balun 1R of Reference Example 1.

FIG. 8 is a horizontal sectional view schematically showing the wiring layer M3 in the thin film balun 1R of Reference Example 1. The configuration other than that of the wiring layer M3 is the same as Example 1. As shown in FIG. 8, a wiring 31 for connecting the coil portions C1 and C2 and a wiring 34 for connecting the coil portions C3 and C4 to the ground terminal G are formed in the wiring layer M3 of the thin film balun 1R. The wiring 31 is a connection (connecting conductor) that connects an end 11*b* of the coil conductor 11 and an end 12*b* of the coil conductor 12 formed in the wiring layer M1 via the two through holes TH1 and TH2. On the other hand, the wiring 34 is a connection (connecting conductor) that connects an end 21*b* of the coil conductor 21 and an end 22*b* of the coil conductor 22 formed in the wiring layer M2 via the two through holes TH3 and TH4. In this way, Reference Example 1 does not include a GND electrode that extends to an area at the unbalanced terminal UT side in Examples 1 to 3.

Characteristic Evaluation 1

Figure 9:
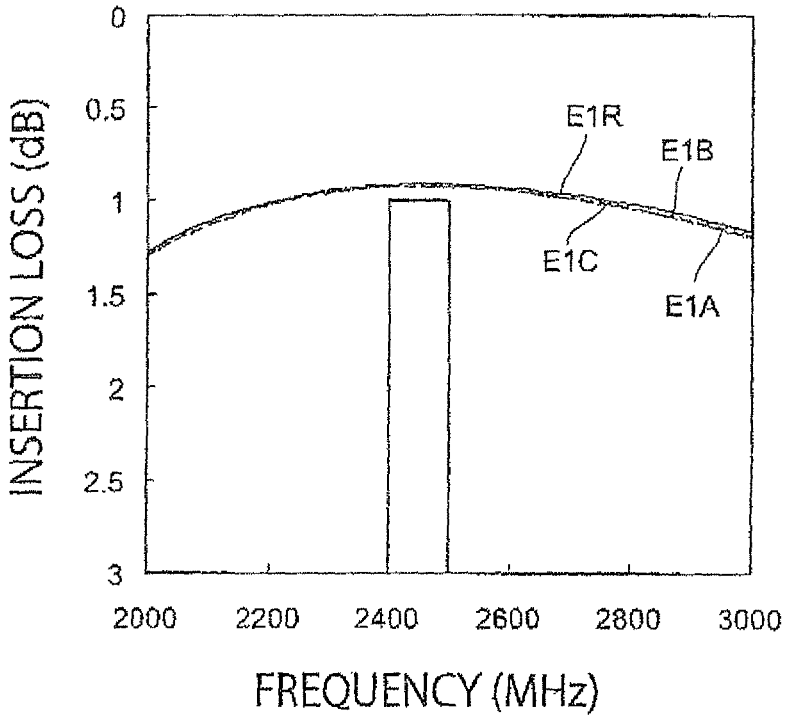
FIG. 9 is a graph showing insertion loss characteristic evaluation results.
Figure 10:
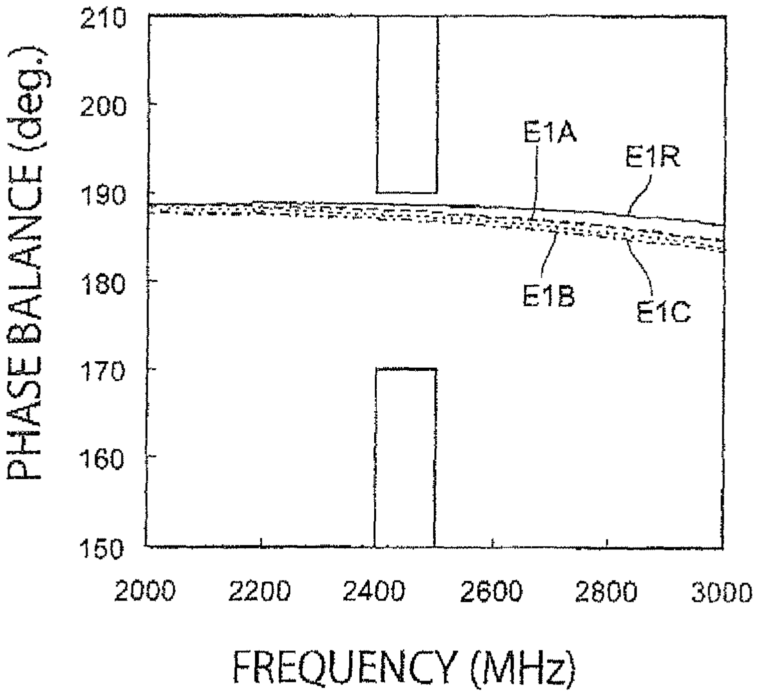
FIG. 10 is a graph showing phase balance characteristic evaluation results.
Figure 11:
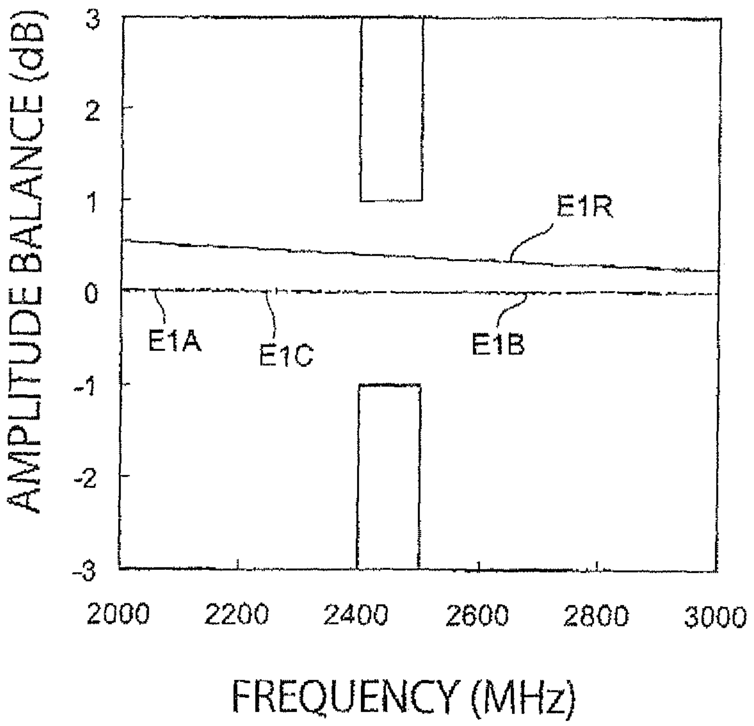
FIG. 11 is a graph showing amplitude balance characteristic evaluation results.

The insertion loss characteristics, phase balance characteristics and amplitude balance characteristics of each of the thin film baluns 1A, 1B, 1C and 1R described above were determined by simulation. Evaluation target frequencies of a transmission signal were set at 2400 MHz to 2500 MHz. FIG. 9 is a graph showing insertion loss characteristic evaluation results, FIG. 10 is a graph showing phase balance characteristic evaluation results, and FIG. 11 is a graph showing amplitude balance characteristic evaluation results. In each drawing, each of the curves E1A, E1B, E1C and E1R show the evaluation results relating to the thin film baluns 1A, 1B, 1C and 1R.

The insertion loss characteristics represent the degree of loss of the passage signal in an evaluation target frequency area, and 0 dB is the ideal insertion loss characteristic in the evaluation target frequency area. The phase balance characteristic is the difference in phase between two balanced signals output from the balanced terminals BT1 and BT2, and 180 deg is a more ideal phase balance. The amplitude balance characteristic is a difference in amplitude between two balanced signals output from the balanced terminals BT1 and BT2, and 0 dB is a more ideal amplitude balance.

These results demonstrate that, compared to the thin film balun 1R of Reference Example 1, the thin film baluns 1A, 1B and 1C of each of the examples has excellent phase balance characteristics while substantially maintaining the insertion loss characteristics, and the improvements in amplitude balance characteristics were remarkable, thereby obtaining nearly ideal amplitude balance characteristics. That is, according to the thin film baluns 1A, 1B and 1C of each of the examples, a wide-band and flat amplitude balance characteristic has been realized. When referring to the evaluation results relating to Examples 1, 2 and 3, the results demonstrate that the phase balance characteristics can be adjusted while maintaining excellent amplitude balance characteristics by adjusting the position and area of the GND electrode. For example, compared to Example 1, in Example 2, the phase balance characteristics were improved while maintaining the excellent amplitude balance characteristics.

Example 4

Figure 12:
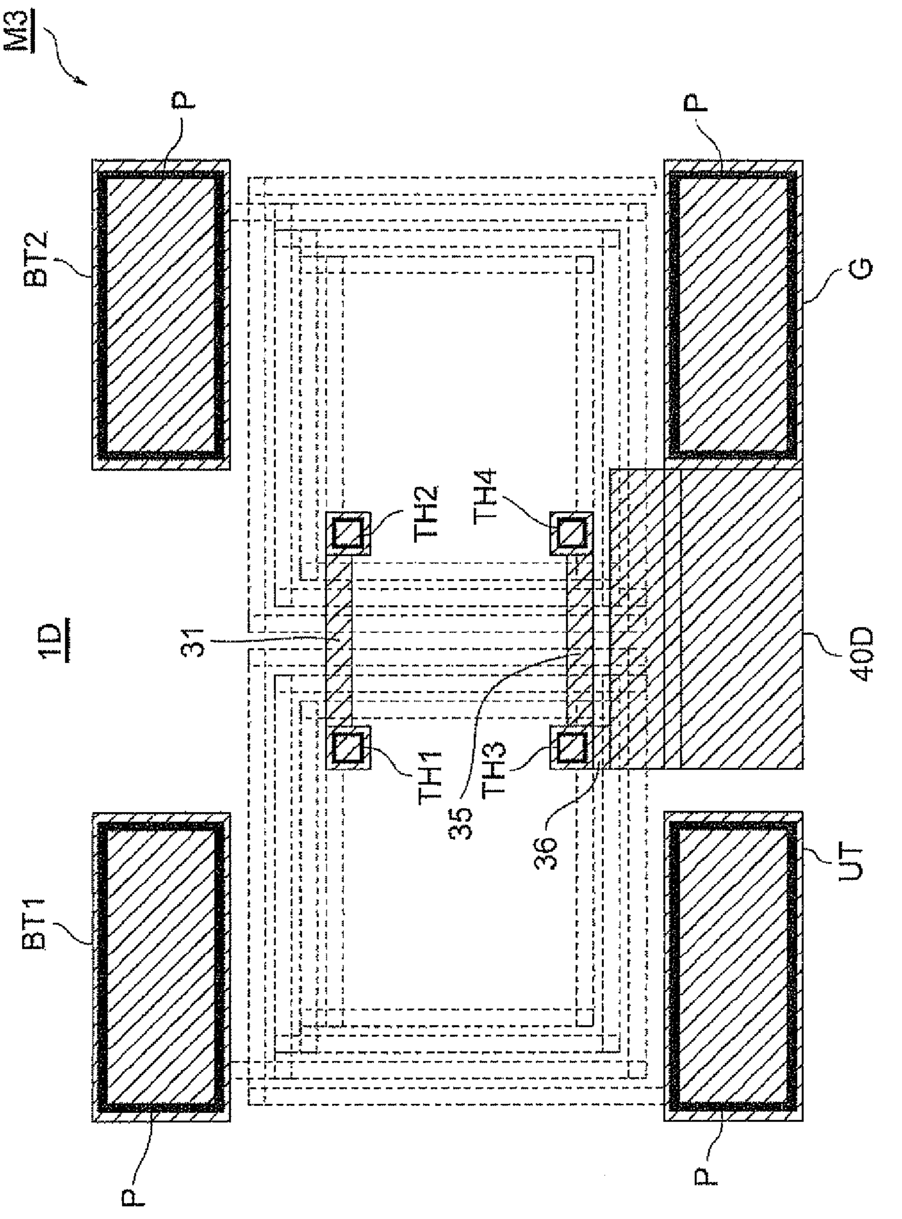
FIG. 12 is a horizontal sectional view in a wiring layer M3 of a thin film balun 1D of Example 4.

FIG. 12 is a horizontal sectional view schematically showing the wiring layer M3 in the thin film balun 1D of Example 4 of the present invention. The configuration other than that of the wiring layer M3 is the same as Example 1. As shown in FIG. 12, the thin film balun 1D comprises a wiring 31 for connecting the coil portions C1 and C2 via the two through holes TH1 and TH2, a wiring (connection) 35 for connecting the coil portions C3 and C4 via the two through holes TH3 and TH4, and a GND electrode 40D for electrically connecting the coil portions C3 and C4 to the ground terminal G. As shown in FIG. 12, the GND electrode 40D is an electrode that extends from the ground terminal G to an area near the unbalanced terminal UT and is formed at a position that includes at least an area facing each part of the coil portions C3 and C4 that constitute the wiring layer M2. The wiring 35 and the GND electrode 40D are connected to each other by a wiring (lead conductor) 36, and the lead conductor 36 is positioned closer to the unbalanced terminal UT than the ground terminal G.

In this way, in the thin film balun 1D of Example 4, the wiring (lead conductor) 36 connecting the wiring (connection) 35 and the GND electrode 40D are positioned closer to the unbalanced terminal UT than the ground terminal G. That is, the length to the ground terminal G of the coil conductor 21 that constitutes the coil portion C3 and the length to the ground terminal G of the coil conductor 22 that constitutes the coil portion C4 including the length of the wiring (connection) 35 are different, and the shapes of the coil portion C3 and the coil portion C4 are asymmetric to each other.

Example 5

Figure 13:
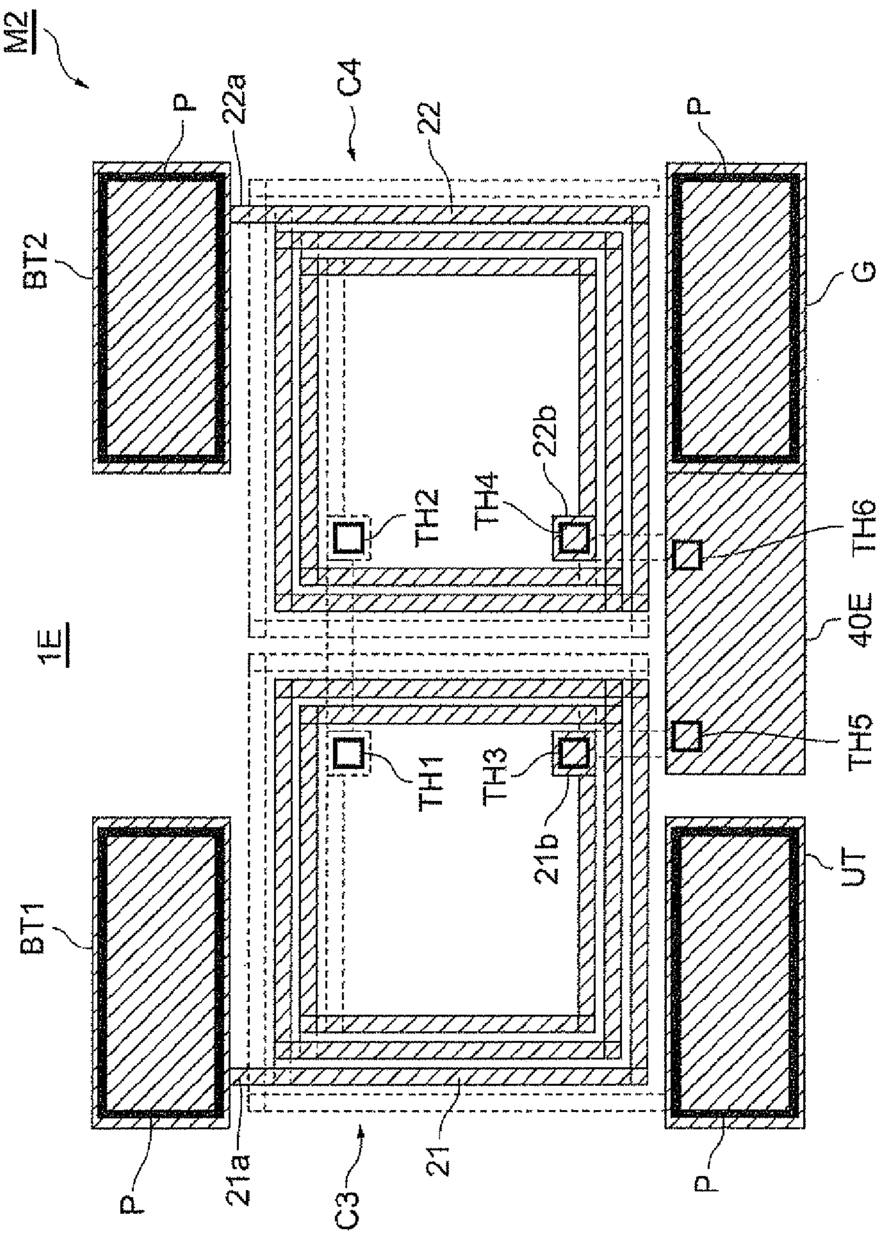
FIG. 13 is a horizontal sectional view in a wiring layer M2 of a thin film balun 1E of Example 5.
Figure 14:
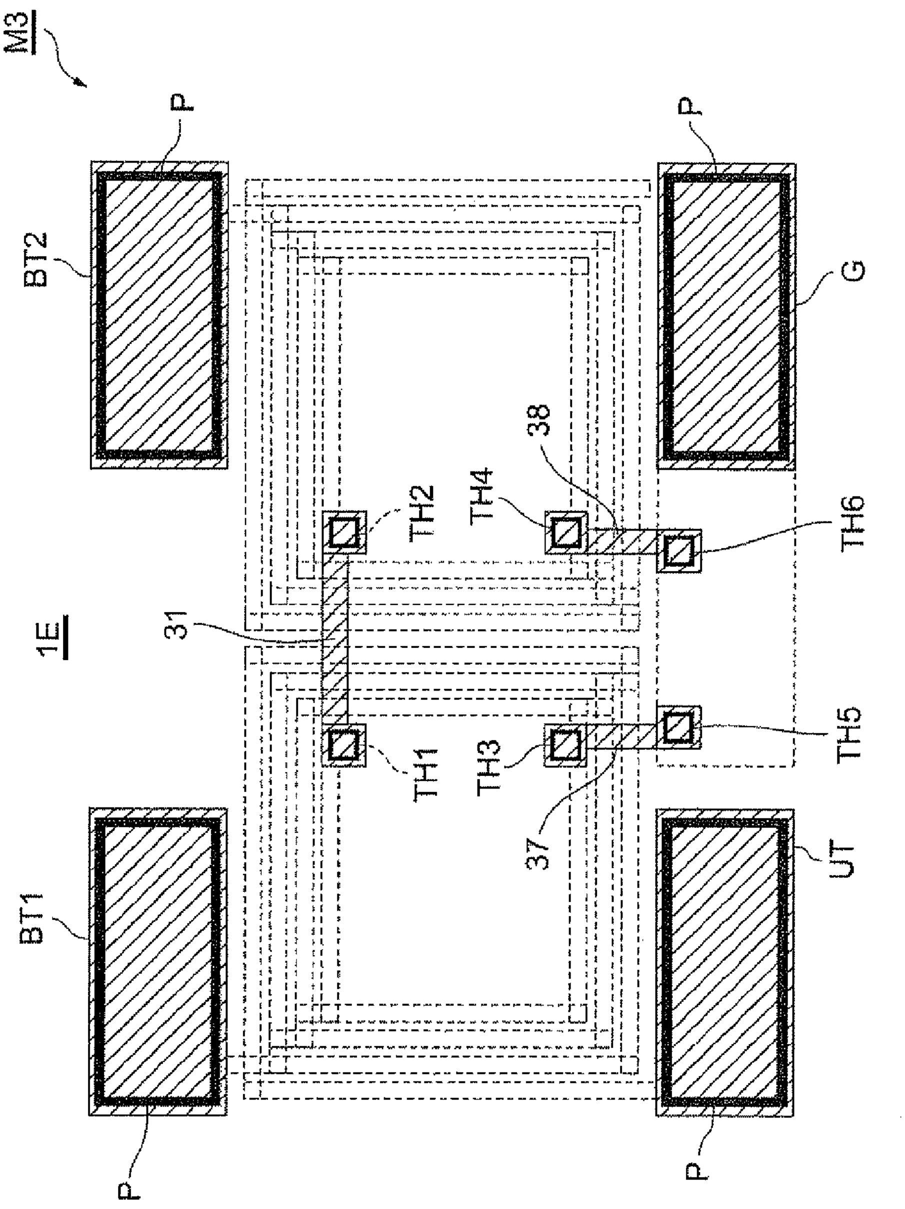
FIG. 14 is a horizontal sectional view in a wiring layer M3 of a thin film balun 1E of Example 5.

FIG. 13 is a horizontal sectional view schematically showing the wiring layer M2 in the thin film balun 1E of Example 5 of the present invention, and FIG. 14 is a horizontal sectional view schematically showing the wiring layer M3 in the thin film balun 1E of Example 5 of the present invention. In addition to the through holes TH1 to TH4 described above, through holes TH5 and TH6 are formed in the thin film balun 1E, and the through holes TH5 and TH6 are plated with a metal conductor for electrical conduction of wiring layers M2 and M3. The configuration other than wiring layers M2 and M3 is the same as Example 1.

As shown in FIG. 13, in contrast to the thin film balun 1A, in the thin film balun 1E, a GND electrode 40E that extends from the ground terminal G to an area near the unbalanced terminal UT is formed in the same layer (wiring layer M2) as the layer in which the coil portions C3 and C4 are formed. As shown in FIG. 14, a wiring 31 for connecting the coil portions C1 and C2 via the two through holes TH1 and TH2, a wiring (connection) 37 for electrically connecting the coil portion C3 and the GND electrode 40E via the through holes TH3 and TH5, and a wiring (connection) 38 for connecting the coil portion C4 and the GND electrode 40E via the through holes TH4 and TH6 are formed. In this way, by positioning the GND electrode 40E at the wiring layer M2, capacitance components are formed in directions above and below the unbalanced terminal UT (laminating direction of the wiring layers). Thus, it is assumed that a greater capacitance component is formed compared to Example 1.

Characteristic Evaluation 2

Figure 15:
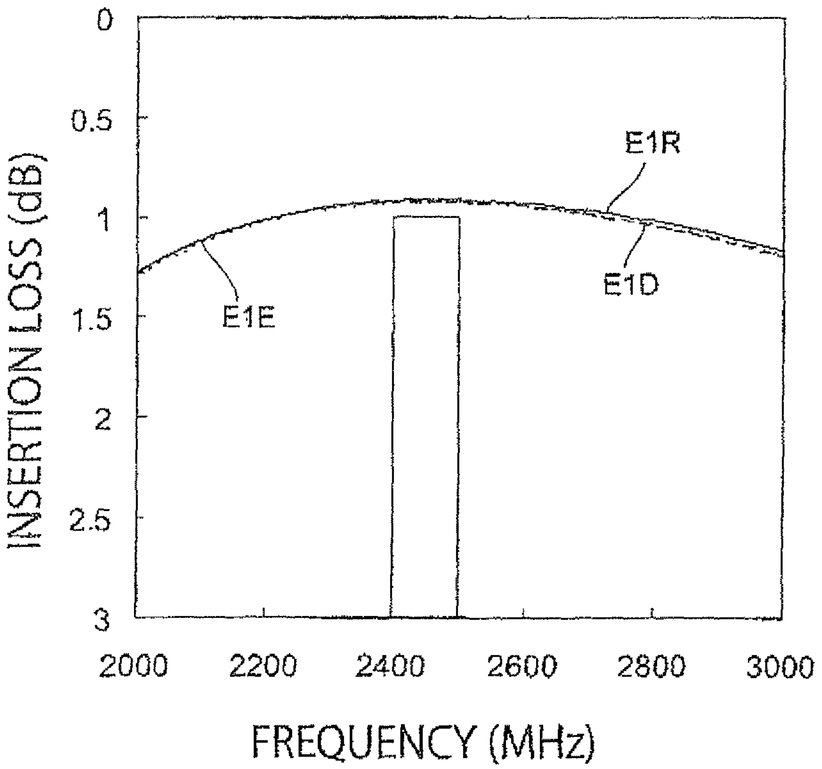
FIG. 15 is a graph showing insertion loss characteristic evaluation results.
Figure 16:
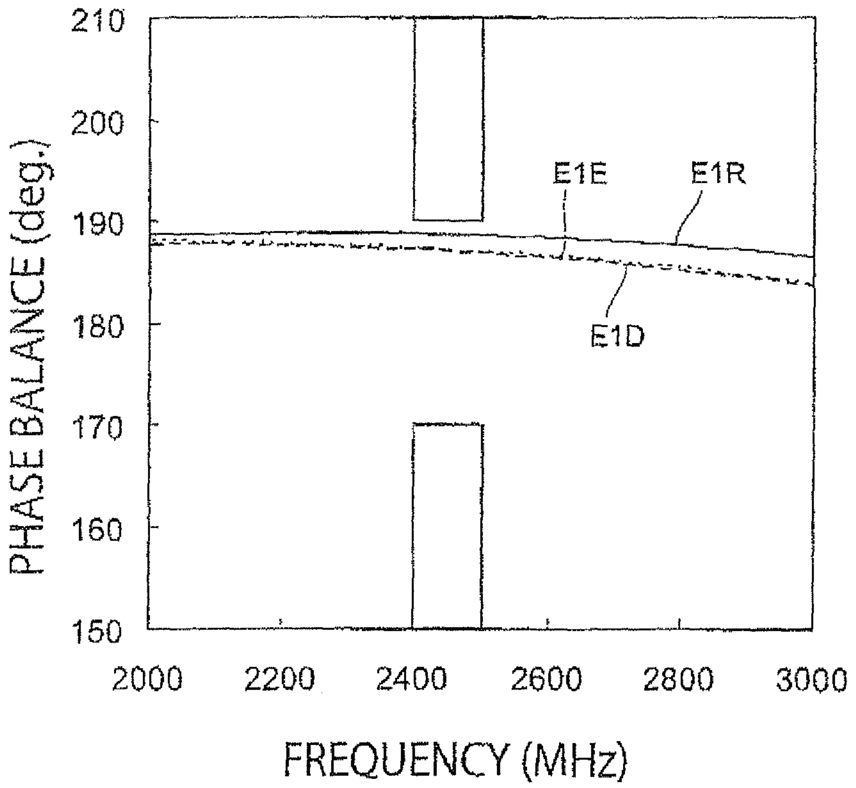
FIG. 16 is a graph showing phase balance characteristic evaluation results.
Figure 17:
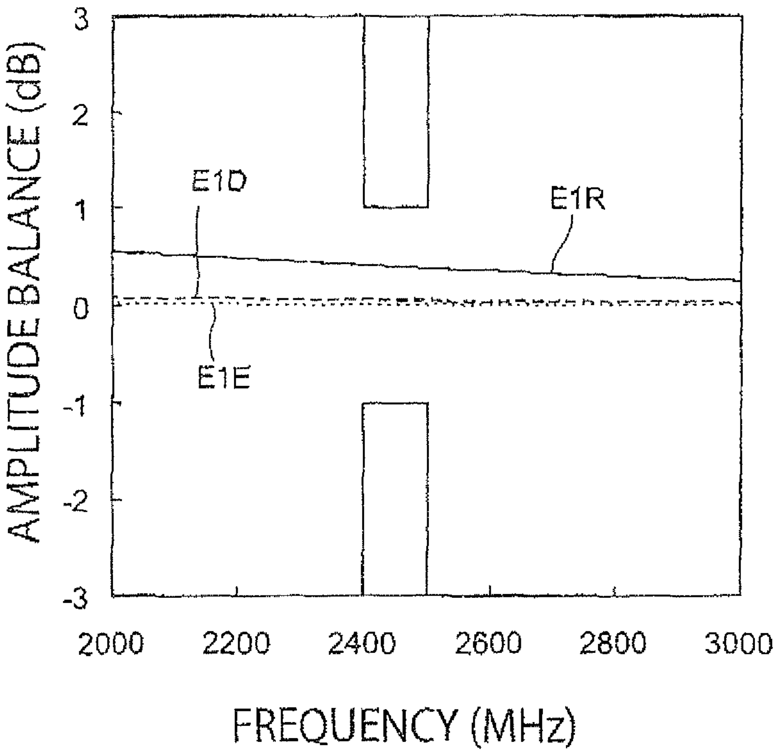
FIG. 17 is a graph showing amplitude balance characteristic evaluation results.

The insertion loss characteristics, phase balance characteristics and amplitude balance characteristics of each of the thin film baluns 1D and 1E described above were determined by simulation. Evaluation target frequencies of a transmission signal were set at 2400 MHz to 2500 MHz. FIG. 15 is a graph showing insertion loss characteristic evaluation results, FIG. 16 is a graph showing phase balance characteristic evaluation results, and FIG. 17 is a graph showing amplitude balance characteristic evaluation results. In each drawing, each of the curves E1D, E1E and E1R show the evaluation results relating to thin film baluns 1D, 1E and 1R.

These results demonstrate that the thin film baluns 1D and 1E of each of the examples has excellent phase balance characteristics while substantially maintaining the insertion loss characteristics compared to the thin film balun 1R of Reference Example 1, and the improvements in the amplitude balance characteristics were remarkable, thereby showing nearly ideal amplitude balance characteristic. It has been found that electrical characteristics that are substantially the same as those of the thin film baluns 1A, 1B and 1C of the above Examples 1 to 3 were obtained.

That is, according to the thin film balun 1D of Example 4, even if the length of the coil portion C3 including the GND line and the length of the coil portion C4 are asymmetrical, it has been found that the same results as those of the thin film baluns 1A, 1B and 1C of Examples 1 to 3 would be obtained. According to the thin film balun 1E of Example 5, it has been found that, even if the GND electrode that extends to an area near the unbalanced terminal UT is provided at the wiring layer M2, the same results as those of thin film baluns 1A, 1B and 1C of Examples 1 to 3 would be obtained. In this case, by positioning the GND electrode at the wiring layer M2, the unbalanced terminal UT is formed so as to penetrate through the wiring layer M2. Thus, the capacitance component between the unbalanced terminal UT and the wiring layer M2 are generated not only in the same layer but also in directions above and below the layer (laminating direction of the wiring layer). As a result, it is assumed that a large capacitance component is formed. In light of this reason, even if a GND electrode that extends to an area near the unbalanced terminal UT is provided at the wiring layer M1, it is considered that results which are the same as these of Examples 1 to 5 would be obtained since similar capacitance components are generated in directions above and below the unbalanced terminal UL (laminating direction of the wiring layer).

Figure 18:
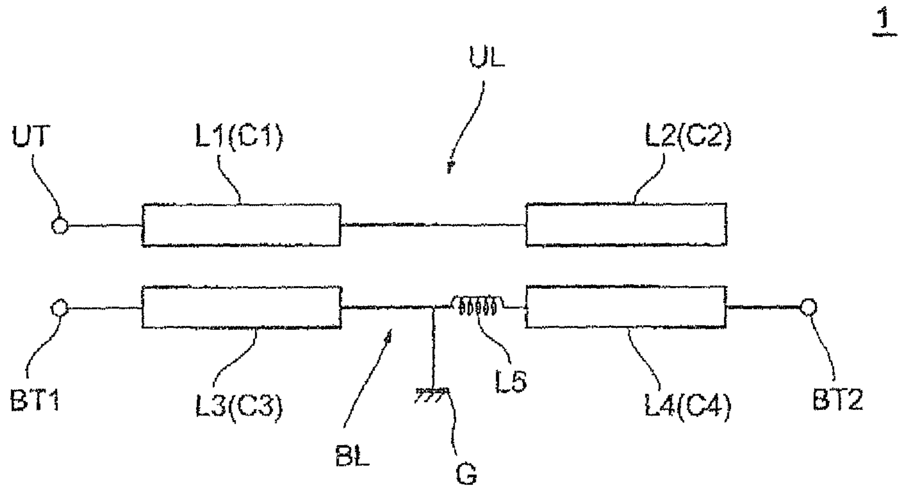
FIG. 18 is an equivalent circuit diagram showing a configuration of an another embodiment of a thin film balun of the present invention.

Next, FIG. 18 is an equivalent circuit diagram showing a configuration of another suitable embodiment according to the thin film balun of the present invention. As shown in FIG. 18, the thin film balun 1 in the present embodiment is configured in the same manner as the thin film balun 1 in the embodiment shown in FIG. 1 except that an L component (coif component) L5 is provided between the line portion L3 and the line portion L4.

Example 6

A pattern of each of the wiring layers M1, M2 and M3 in an example of the thin film balun of the present embodiment is described in detail below. Note that coil portions C1 to C4 are used as the line portions L1 to L4 also in the following example.

Figure 19:
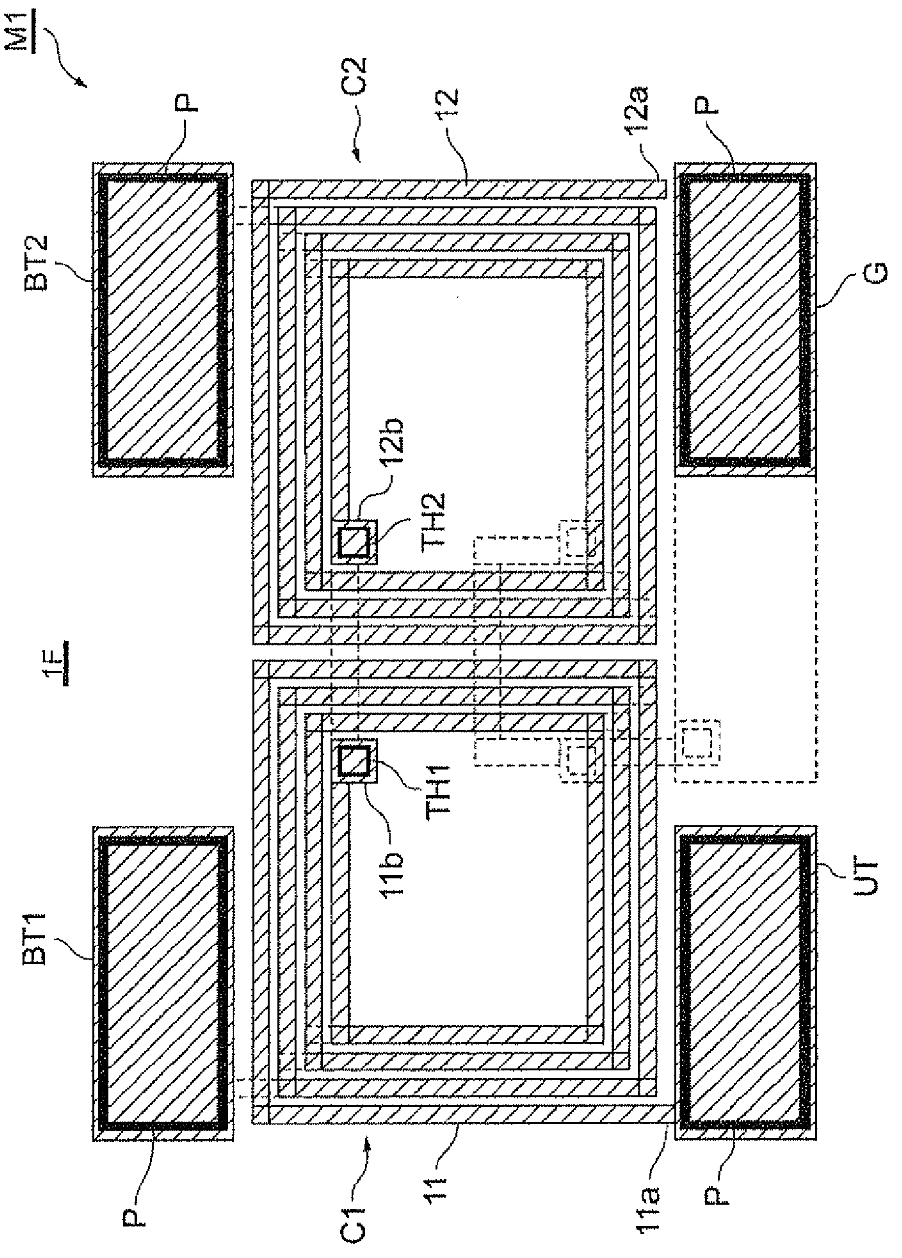
FIG. 19 is a horizontal sectional view in a wiring layer M1 of a thin film balun 1F of Example 6.
Figure 20:
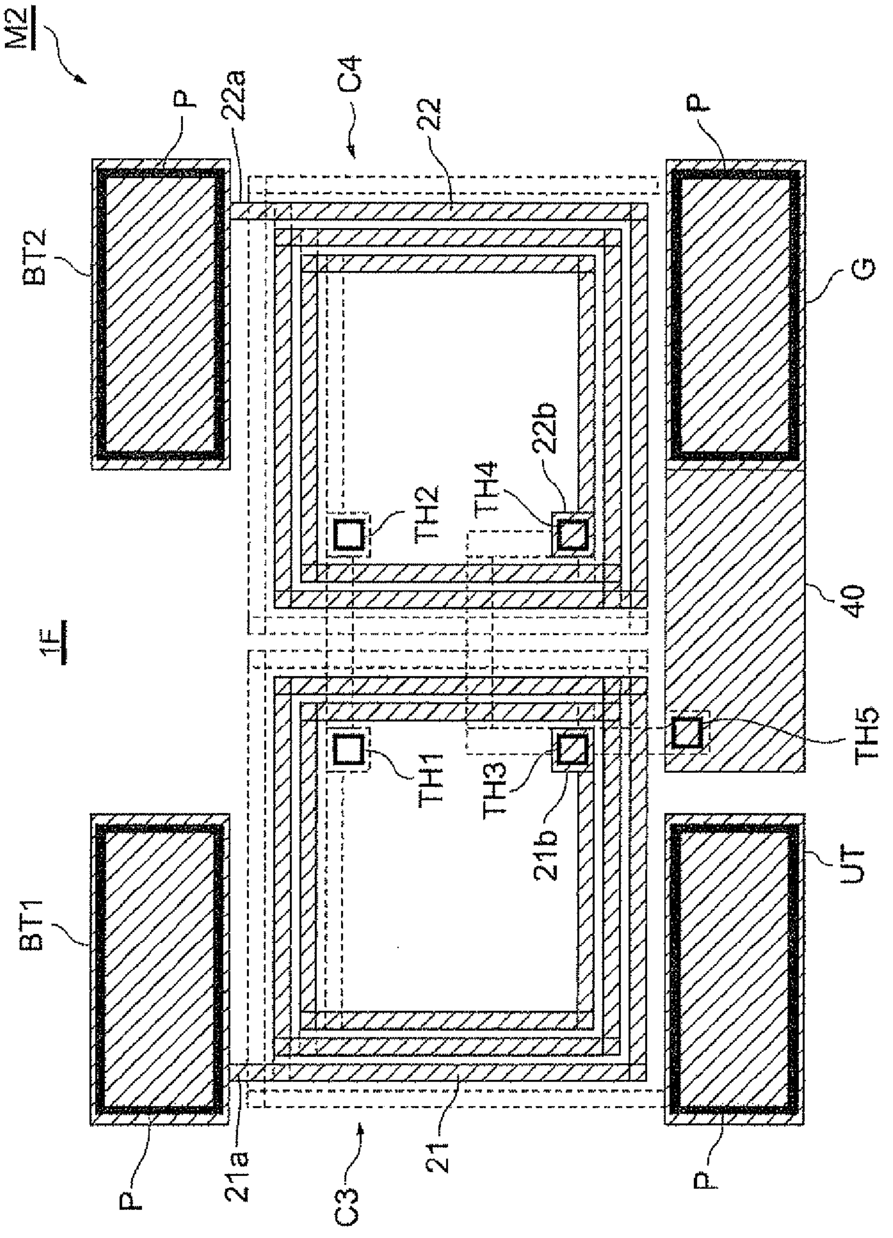
FIG. 20 is a horizontal sectional view in a wiring layer M2 of a thin film balun 1F of Example 6.
Figure 21:
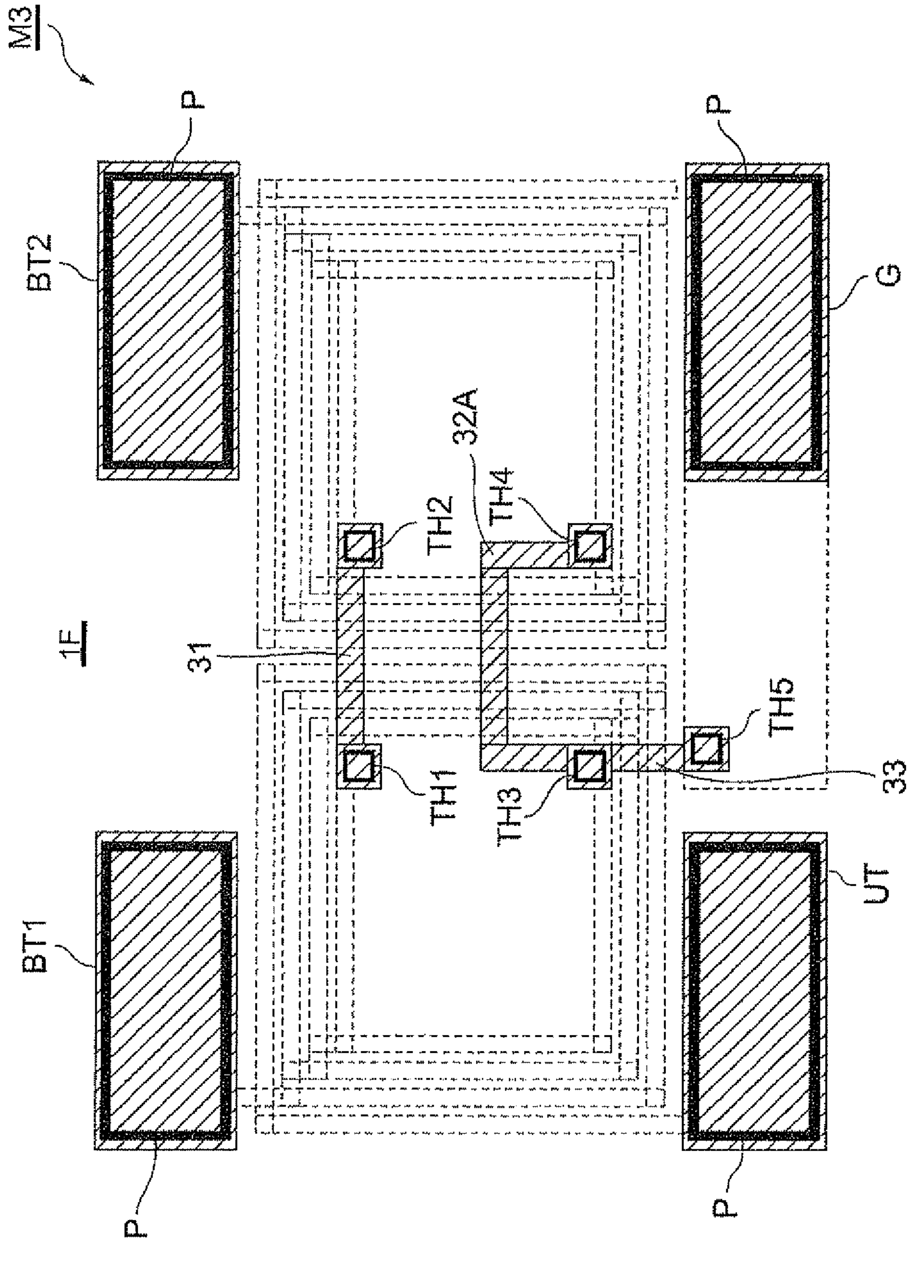
FIG. 21 is a horizontal sectional view in a wiring layer M3 of a thin film balun 1F of Example 6.

FIGS. 19 to 21 are horizontal sectional views schematically showing each wiring layer in the thin film balun 1F of Example 6 of the present invention, respectively. As shown in FIGS. 19 to 21, a unbalanced terminal UT, balanced terminals BT1 and BT2 and a ground terminal G are formed in all of the wiring layers M1 to M3. Each of the terminals UT, BT1, BT2 and G is electrically connected between different layers via a through hole P. A configuration of each of the wiring layers M1 to M3 is described in detail below.

As shown in FIG. 19, the coil portion C1 (first line portion, first coil portion) and the coil portion C2 (second line portion, second coil portion) that constitute the unbalanced transmission line UL are formed adjacent to each other in the wiring layer M1. Specifically, the unbalanced transmission line UL is constituted by two bilateral coil portions (spiral coils). Each of the coil portions C1 and C2 constitutes an equivalent of a quarter-wavelength (λ/4) resonator. These coil portions C1 and C2 are positioned facing the coil portions C3 and C4 of the balanced transmission line BL respectively, and the facing portions are electromagnetically coupled to form couplers.

Through holes TH1 and TH2 are formed in the wiring layer M1, and these through holes TH1 and TH2 are plated with a metal conductor for electrical conduction of wiring layers M1 to M3. In the wiring layer M1, an outer end 11*a* of the coil conductor 11 constituting the coil portion C1 is connected to the unbalanced terminal UT, and an inner end 11*b* of the coil conductor 11 is connected to a through hole TH1. On the other hand, an inner end 12*b* of the coil conductor 12 constituting the coil portion C2 is connected to a through hole TH2, and an outer end 12*a* of the coil conductor 12 is an open end and is open near the ground terminal G. The coil conductors 11 and 12 are connected to each other via a wiring (connecting conductor) 31 of the wiring layer M3 shown in FIG. 5. Note, however, that there is no limitation on the widths and the number of turns of the coil conductors 11 and 12, and the widths and the number of turns of the coil conductors 11 and 12 may be equal or different.

As shown in FIG. 20, the coil portion C3 (third line portion, third coil portion) and the coil portion C4 (fourth line portion, fourth coil portion) that constitute the balanced transmission line BL are formed adjacent to each other in the wiring layer M2. Specifically, the balanced transmission line BL is constituted by two bilateral coil portions (spiral coils). Each of the coil portions C3 and C4 constitutes an equivalent of a quarter-wavelength (λ/4) resonator.

A GND electrode 40 that extends from the ground terminal G to an area near the unbalanced terminal UT is formed in the wiring layer M2. In addition to the through holes TH1 and TH2 described above, through holes TH3 to TH5 are formed in the wiring layer M2, and the through holes TH3 to TH5 are plated with a metal conductor such as Cu for electrical conduction of wiring layers M2 and M3.

In the wiring layer M2, an outer end 21*a* of the coil conductor 21 that constitutes the coil portion C3 is connected to the balanced terminal BT1 and an inner end 21*b* of the coil conductor 21 is connected to the through hole TH3. On the other hand, an outer end 22*a* of the coil conductor 22 that constitutes the coil portion C4 is connected to the balanced terminal BT2, and an inner end 22*b* of the coil conductor 22 is connected to the through hole TH4. Coil conductors 21 and 22 are connected to each other via a wiring (L component) 32 of the wiring layer M3 shown in FIG. 21.

As shown in FIG. 21, a wiring (connection) 31 for connecting the coil portions C1 and C2 of the unbalanced transmission line UL via the two, through holes TH1 and TH2, a wiring (L component) 32A for connecting the coil portions C3 and C4 of the balanced transmission line BL via the two through holes TH3 and TH4, and a wiring (GND line) 33 for electrically connecting the coil portion C3 and the GND electrode 40 via the through hole TH5 are formed in the wiring layer M3.

The wiring 32A that connects coil portions C3 and C4 extend from the through hole TH3 to the through hole TH4 such that the wiring 32A bypasses, the side in which the through holes TH1 and TH2 are formed. With such structure, a current that flows in the opposite direction to the current that flows in the coil portions C3 and C4 flows in this wiring 32A, and this functions as an L component that weakens the magnetic field of the balanced transmission line BL. That is, the L component can be considered as a reverse winding coil that is wound in the opposite direction to the winding of the coil conductors of the coil portions C3 and C4 so as to cancel the magnetic field in the balanced transmission line.

Specifically, as shown in FIG. 21, by positioning the connection point that connects the GND line 33 and the wiring (L component) 32A at a position on the wiring 32A at the through hole TH3 side, a reverse winding coil may be formed from a part of the wiring 32A closer to the coil portion C4 than said connection point (connection junction point). The L component is provided between the coil portions C3 and C4 in such a way, thereby changing the impedance of the circuit and improving the impedance matching characteristics, and it is assumed that a thin film balun with excellent electrical characteristics can be obtained. Note, however, that the function is not limited to such.

Needless to say, since the reverse winding coil simply has to be formed to cancel the magnetic field in the balanced transmission line, the reverse winding coil may be configured in the direction opposite to the winding direction of the coil conductor of either one of the coil portions C3 and C4. The L component is not limited to the illustrated structure, and it simply has to be a wiring that electrically connects the coil portions C3 and C4 and have a curved portion in a part thereof. For example, the L component may be a structure including a half-winding coil form that does not complete a full cycle (1 turn) but only completes a half cycle (0.5 turn), or may be a circular or meandering form.

As described above, in the present example, a thin film balun 1F forming the equivalent circuit shown in FIG. 18 is constituted by a multilayer wiring structure in which the two coil portions C1 and C2 constituting the unbalanced transmission line UL are formed in the wiring layer M1 which is one layer, the two coil portions C3 and C4 constituting the balanced transmission line BL are formed in the wiring layer M2 which is another layer adjacent to the wiring layer M1, and a wiring (connecting conductor) 31 connecting the coil portions C1 and C2, a wiring (L component) 32A connecting the coil portions C3 and C4 and a wiring (GND line) 33 connecting the coil portions C3 and C4 and the ground terminal G are formed in the wiring layer M3 which is another layer adjacent to the wiring layer M2 on the opposite side to the wiring layer M1.

According to a configuration of such thin film balun 1F, an improvement in electrical characteristics may be expected due to a change in an electromagnetic coupling state.

Next, various examples and reference example have been used to evaluate the influence on the balance characteristics of the thin film balun 1 (FIG. 18) of the present embodiment that is caused by the structure of the wiring 32A of the coil portions C3 and C4. The evaluation results of such balanced characteristics will be described after the explanations of the layouts of the examples and reference examples.

Example 7

Figure 22:
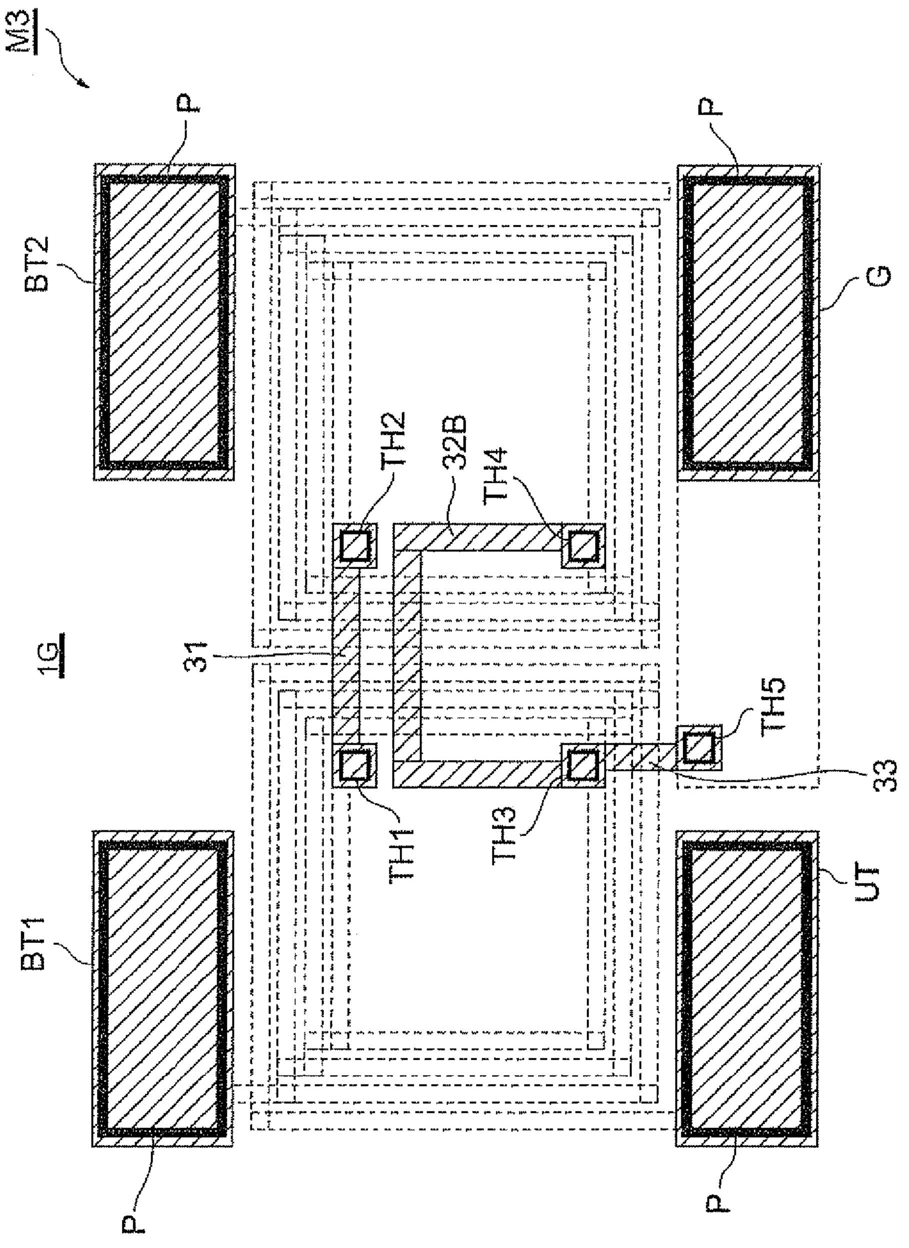
FIG. 22 is a horizontal sectional view in a wiring layer M3 of a thin film balun 1G of Example 7.

FIG. 22 is a horizontal sectional view schematically showing the wiring layer M3 in the thin film balun 1G of Example 7 of the present invention. The configuration other than that of the wiring layer M3 is the same as Example 6. As shown in FIG. 22, in the thin film balun 1G, the structure of the wiring 32B that connects the coil portions C3 and C4 is different from the structure of the wiring 32A of the thin film balun 1F of Example 6, and the wiring 32B is formed to bypass at a level upper than the wiring 32A of Example 6. That is, the wiring 32B extends from the through hole TH3 to an area near the through hole TH1, extends in parallel or substantially parallel to the wiring 31 from an area near the through hole TH1 to an area near the through hole TH2, and extends from an area near the through hole TH2 to the through hole 4.

Reference Example 2

Figure 23:
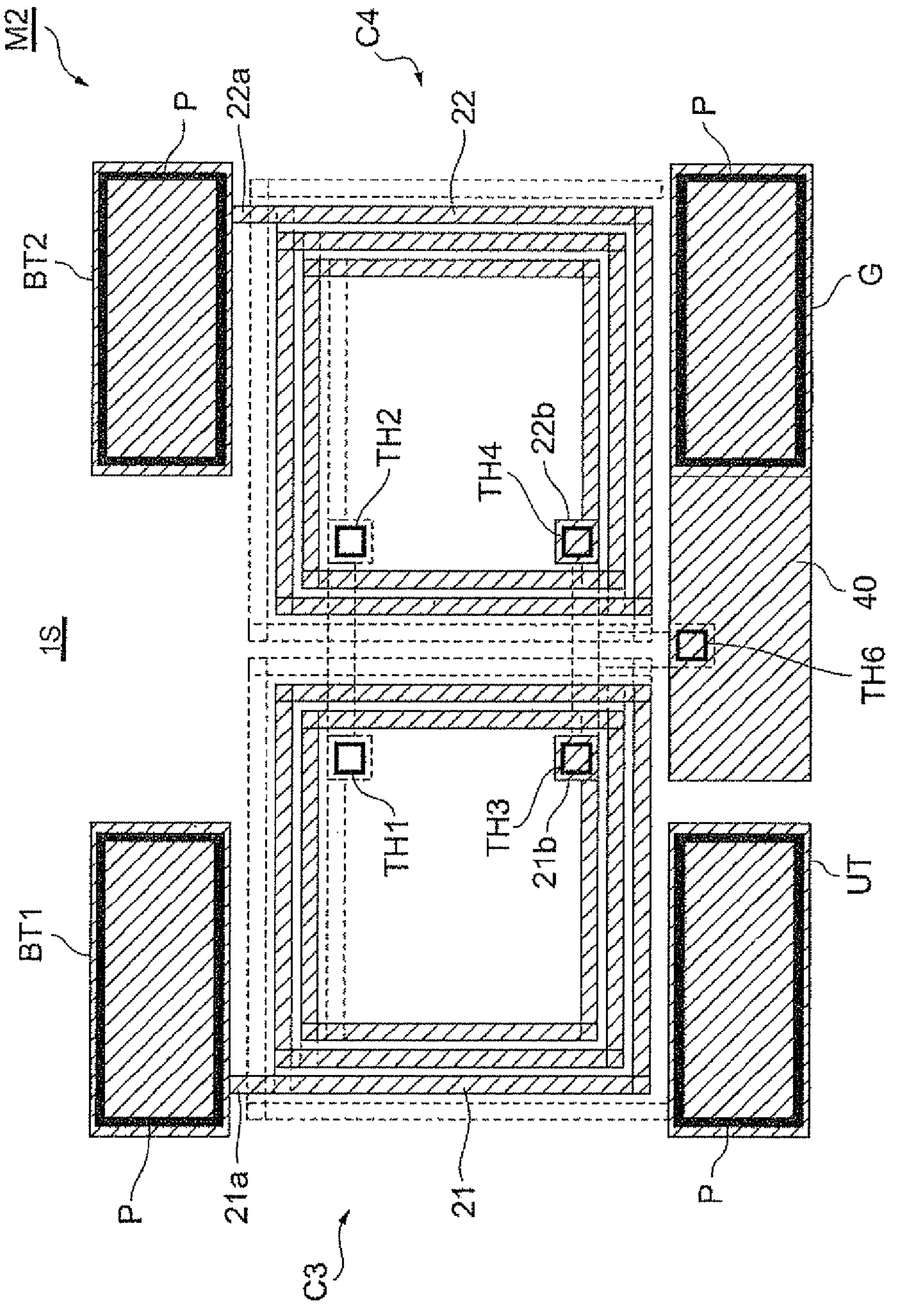
FIG. 23 is a horizontal sectional view in a wiring layer M2 of a thin film balun 1S of Reference Example 2.
Figure 24:
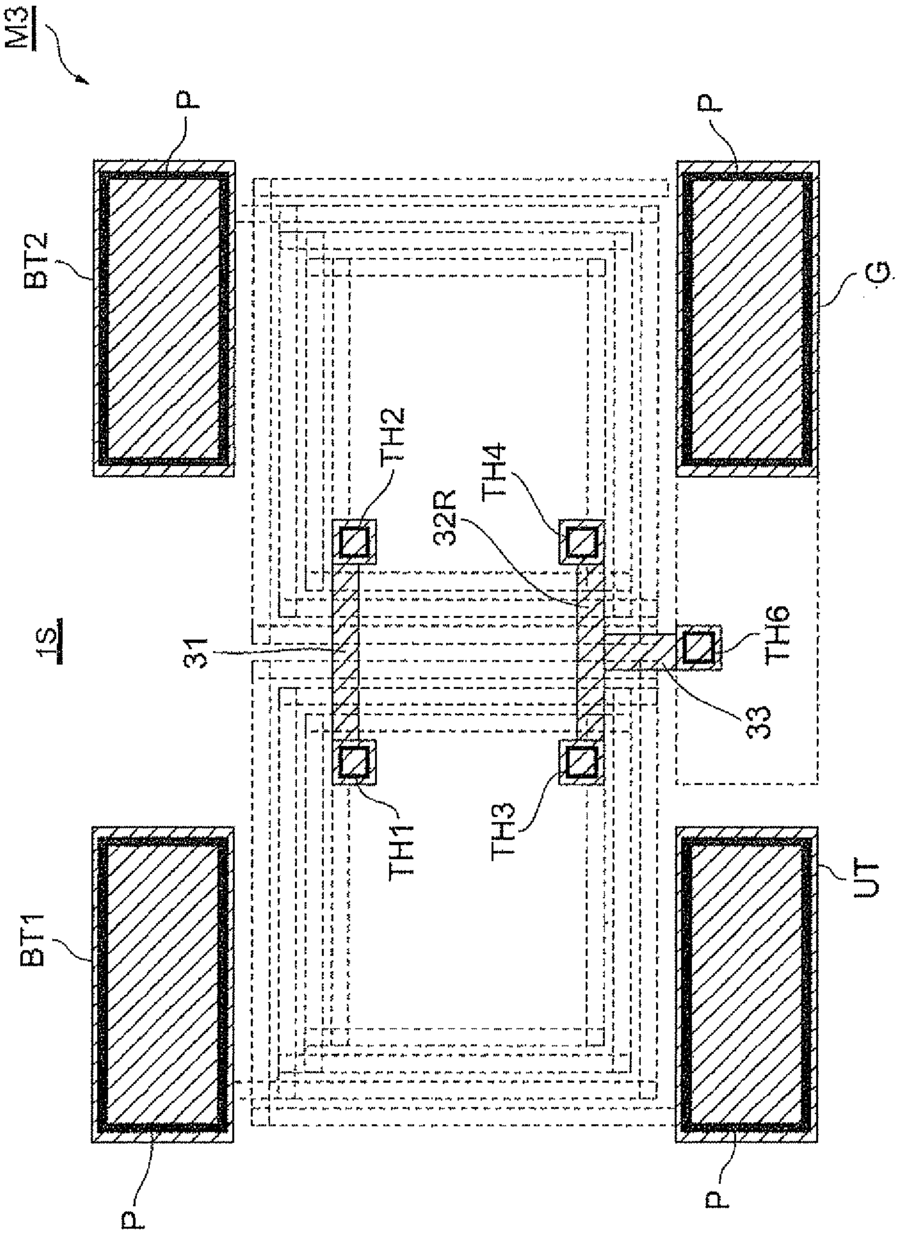
FIG. 24 is a horizontal sectional view in a wiring layer M3 of a thin film balun 1S of Reference Example 2.

FIG. 23 is a horizontal sectional view schematically showing the wiring layer M2 in the thin film balun 1S of Reference Example 2, and FIG. 24 is a horizontal sectional view schematically showing the wiring layer M3 in the thin film balun 1S of Reference Example 2. The configuration other than that of the wiring layers M2 and M3 is the same as that of Example 6. As shown in FIGS. 23 and 24, a through hole TH6 is formed instead of the through hole TH5 of Example 6 in the wiring layers M2 and M3 of the thin film balun 1S.

Since this causes the phase characteristics to be influenced according to the length of the transmission line not only in the thin film balun 1S but also in a balun that is manufactured using LTCC (Low Temperature Co-fired Ceramics), it is desirable to design the lengths of the coil portions C3 and C4 including the GND line to be as similar as possible. Furthermore, since the GND line carries excess L components the longer the GND line is and easily influences the electrical characteristics, it is desirable that the GND line is as short as possible.

In order to verify the effect of the thin film balun with the configuration of Example 6, a thin film balun 1S with a structure that leads the GND line 33 from the center of the wiring 32R that connects the through holes TH3 and TH4 and electrically connects the GND line 33 to the GND electrode 40 of the wiring layer M2 via the through hole TH6 with the shortest distance has been provided as a reference.

In the thin film balun 1S, a wiring 31 for connecting coil portions C1 and C2 and a wiring 32R for connecting the coil portions C3 and C4 to the ground terminal G are formed in the wiring layer M3. The wiring 31 is a connection (connecting conductor) that connects an end 11*b* of the coil conductor 11 and an end 12*b* of the coil conductor 12 formed in the wiring layer M1 via the two through holes TH1 and TH2. On the other hand, the wiring 32R is a connection (connecting conductor) that connects an end 21*b* of the coil conductor 21 and an end 22*b* of the coil conductor 22 formed in the wiring layer M2 via the two through holes TH3 and TH4. In this way, Reference Example 2 is an example in which the wiring 32R does not extend from the through hole TH3 to the through hole TH4 such that the wiring 32A bypasses the side in which the through holes TH1 and TH2 are formed (Examples 6 and 7).

The equivalent circuit diagram of the thin film balun 1S of Reference Example 2 is the same as the one shown in FIG. 2. As seen from FIGS. 2 and 18, the difference between the equivalent circuit diagram of the thin film balun 1S of Reference Example 2 and the equivalent circuit diagram of the thin film balun 1F of Example 6 is that whether or not there is an L component L5 between the coil portions C3 and C4.

Characteristic Evaluation 3

Figure 25:
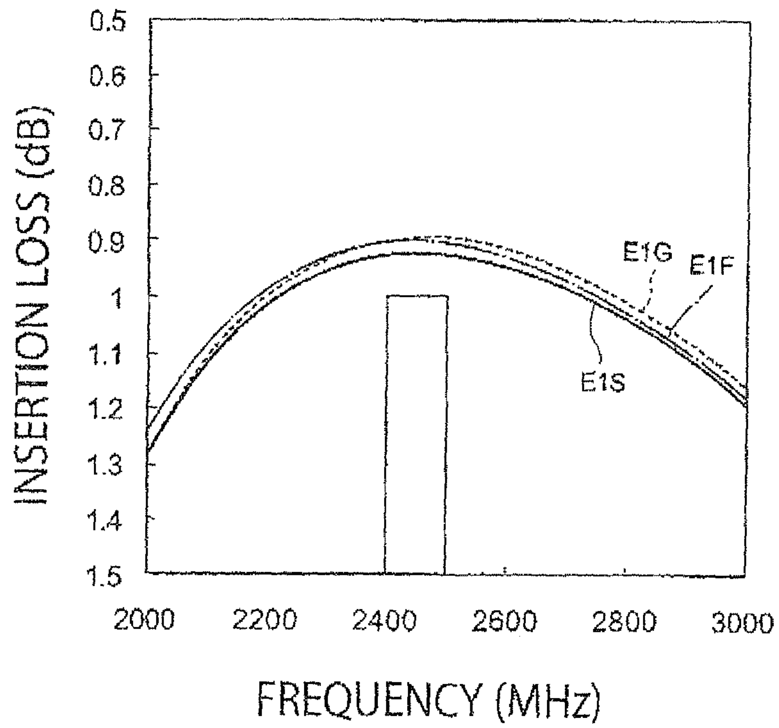
FIG. 25 is a graph showing insertion loss characteristic evaluation results.
Figure 26:
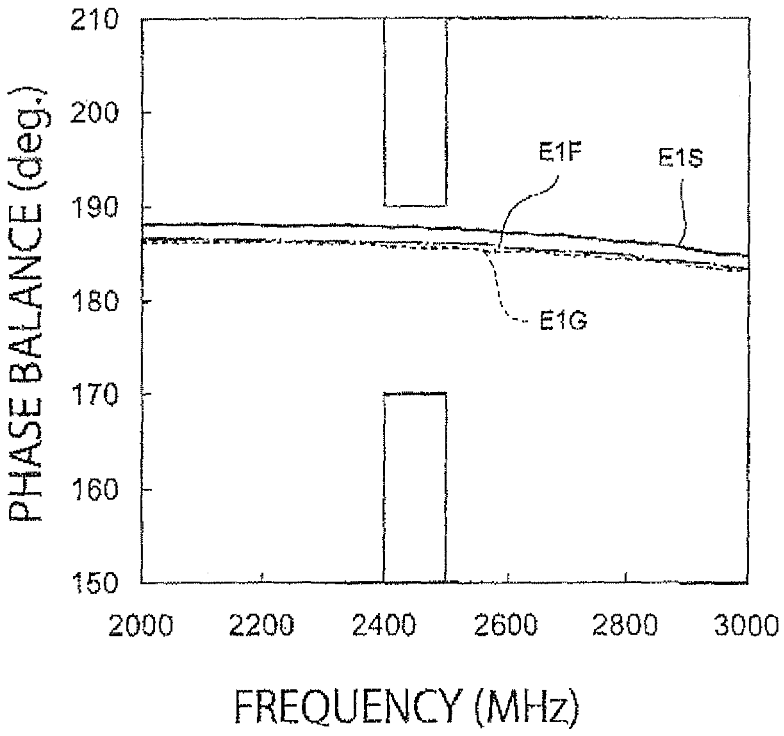
FIG. 26 is a graph showing phase balance characteristic evaluation results.
Figure 27:
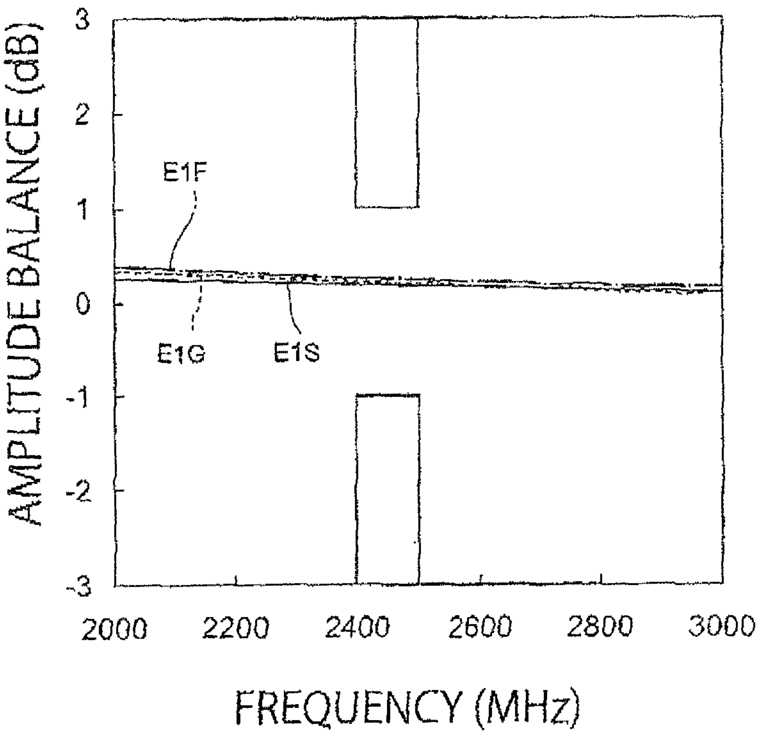
FIG. 27 is a graph showing amplitude balance characteristic evaluation results.
Figure 28:
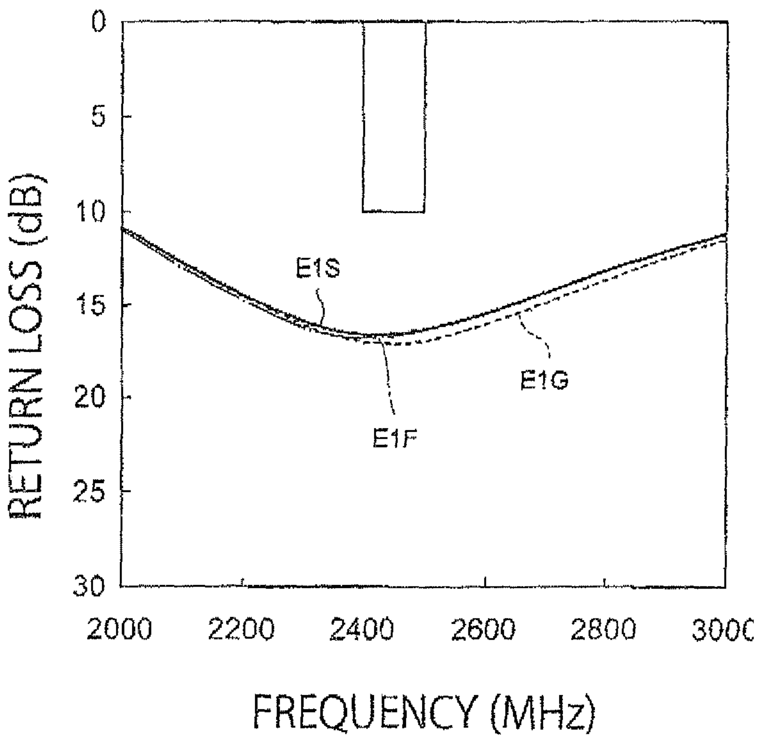
FIG. 28 is a graph showing return loss (reflection) characteristic evaluation results.

The insertion loss characteristics, phase balance characteristics, amplitude balance characteristics and return loss characteristics of each of the thin film baluns 1F, 1G and 1S described above were determined by simulation. Evaluation target frequencies of a transmission signal were set at 2400 MHz to 2500 MHz, FIG. 25 is a graph showing insertion loss characteristic evaluation results, FIG. 26 is a graph showing phase balance characteristic evaluation results, FIG. 27 is a graph showing amplitude balance characteristic evaluation results, and FIG. 28 is a graph showing return loss characteristic evaluation results. In each drawing, each of the curves E1F, E1G and E1S show the evaluation results of thin film baluns 1F, 1G and 1S.

The significance of insertion loss characteristics, phase balance characteristics and amplitude balance characteristics are as described above. Regarding the return loss characteristics, it is ideal that there is no reflection from the component, and thus the characteristics can be considered to be better when the value of the return loss is larger.

These results demonstrate that, compared to the thin film balun 1S of Reference Example 2, the thin film baluns 1F and 1G of each of the examples has excellent insertion loss characteristics and phase balance characteristics while substantially maintaining the amplitude balance characteristics and return loss characteristics. When referring to the results of the insertion loss characteristics and return loss characteristics in Examples 6 and 7, a high-frequency shift of center frequency due to the formation of an L component (wirings 32A and 32B) between the coil portions C3 and C4 in a direction that weakens the magnetic field of the balanced transmission line BL (direction for canceling the magnetic field) is slightly evident. It has been found that the thin film balun 1G of Example 7 with a structure that weakens the magnetic field more than the thin film balun 1F of Example 6 shows a greater improvement in the electrical characteristics. These evaluation results demonstrate that, by adjusting the structure of the wiring that connects the coil portions C3 and C4, particularly, the magnitude of the L component, various desired characteristics of the thin film balun can be sufficiently maintained as well as improving electrical characteristics such as insertion loss characteristics.

The influence on the electrical characteristics of the thin film balun caused by the L component that is provided between the coil portions C3 and C4 and functions in a direction that weakens the magnetic field of the balanced transmission line was evaluated using the thin film balun 1H of Example 8 and the thin film balun 1I of Example 9. The electrical characteristics thereof will be described after the explanations of the layouts of Examples 8 and 9.

Example 8

Figure 29:
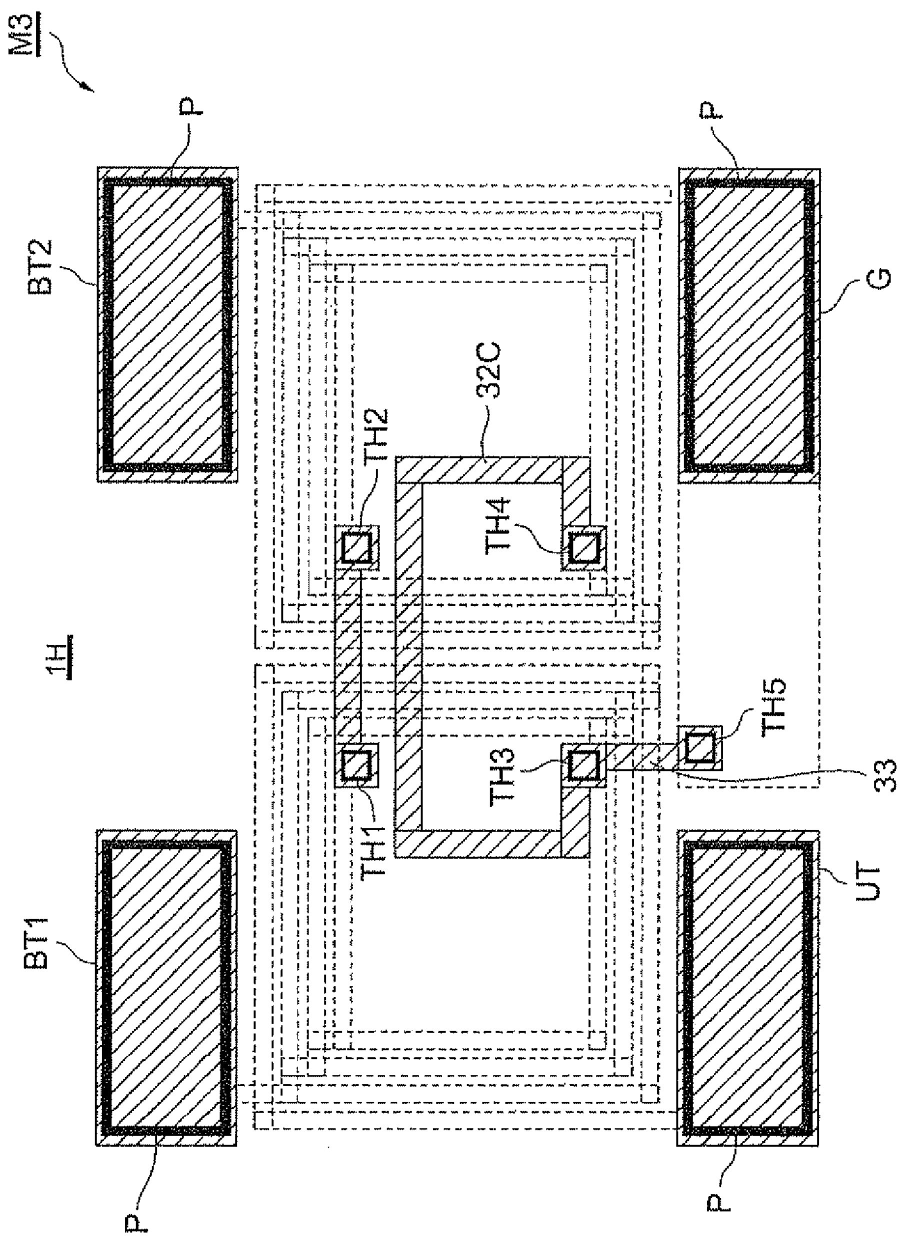
FIG. 29 is a horizontal sectional view in a wiring layer M3 of a thin film balun 1H of Example 8.

FIG. 29 is a horizontal sectional view schematically showing the wiring layer M3 in the thin film balun 1H of Example 8 of the present invention. The configuration other than that of the wiring layer M3 is the same as Example 6. As shown in FIG. 29, in the thin film balun 1H, the structure of the wiring 32C connecting the coil portions C3 and C4 is different from the structures of the wirings 32A and 32B of the thin film baluns 1F and 1G of Examples 6 and 7 described above, and the wiring 32C has a structure that functions to weaken the magnetic field of the balanced transmission line more remarkably. Specifically, the wiring 32C is positioned at areas facing the openings of the coil conductors of the coil portions C3 and C4 such that the wiring 32C extends from the through hole TH3 to an area near the through hole TH1 in a manner bypassing over the opening of the coil conductor of the coil portion C3, extends from an area near the through hole TH1 to an area near the through hole TH2 and extends from an area near the through hole TH2 to the through hole TH4 in a manner bypassing over the opening of the coil conductor of the coil portion C4.

Example 9

Figure 30:
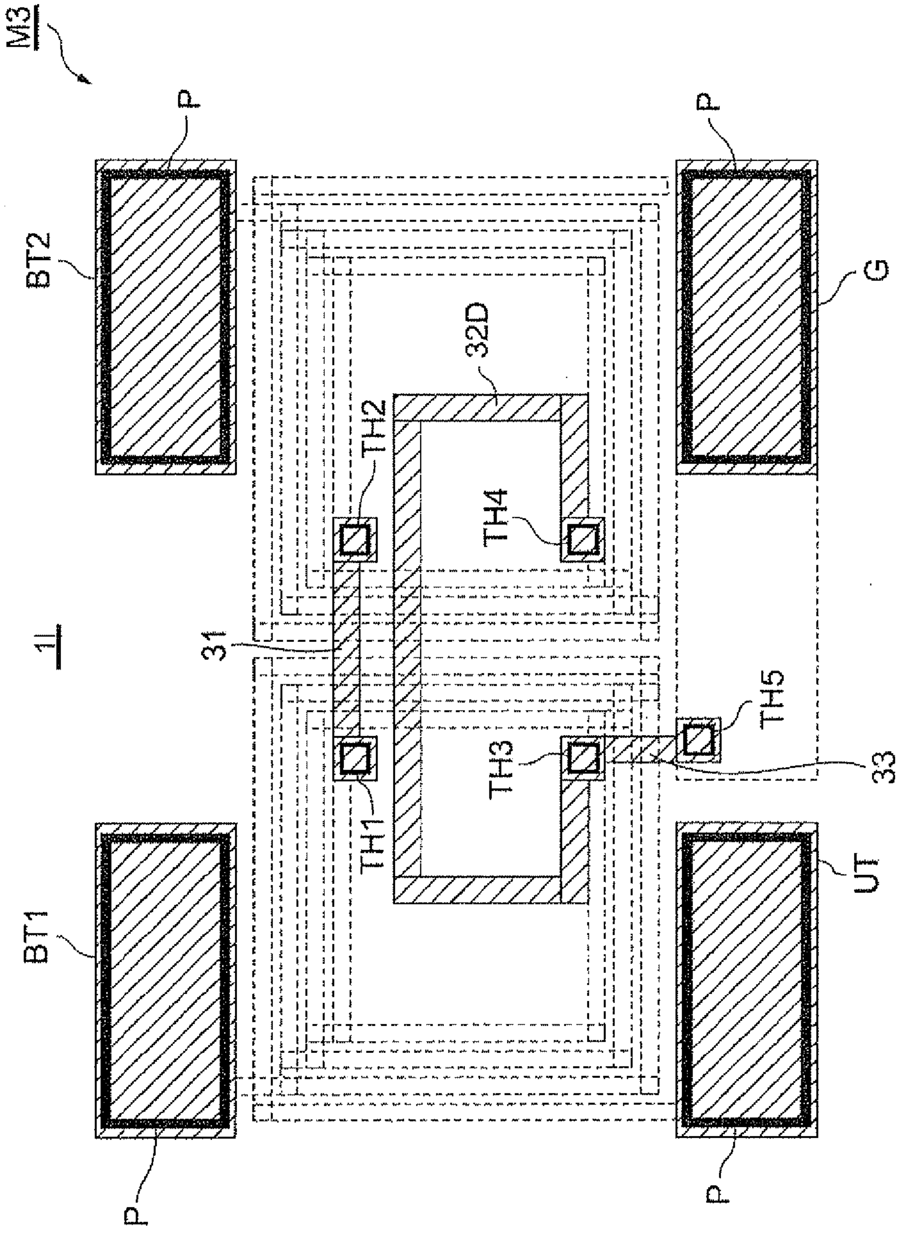
FIG. 30 is a horizontal sectional view in a wiring layer M3 of a thin film balun 1I of Example 9.

FIG. 30 is a horizontal sectional view schematically showing the wiring layer M3 in the thin film balun 1I of Example 9 of the present invention. The configuration other than that of the wiring layer M3 is the same as Example 6. As shown in FIG. 30, the thin film balun 1I is constituted to weaken the magnetic field of the balanced transmission line more than the structure of the thin film balun 1H of Example 8 described above. Specifically, the wiring 32C extends from the through hole TH3 to an area near the through hole TH1 in a manner bypassing over and at the center of the opening of the coil conductor of the coil portion 3, extends from an area near the through hole TH1 to an area near the through hole TH2 and extends from an area near the through hole TH2 to the through hole TH4 in a manner bypassing over and at the center the opening of the coil conductor of the coil portion C4.

Characteristic Evaluation 4

Figure 31:
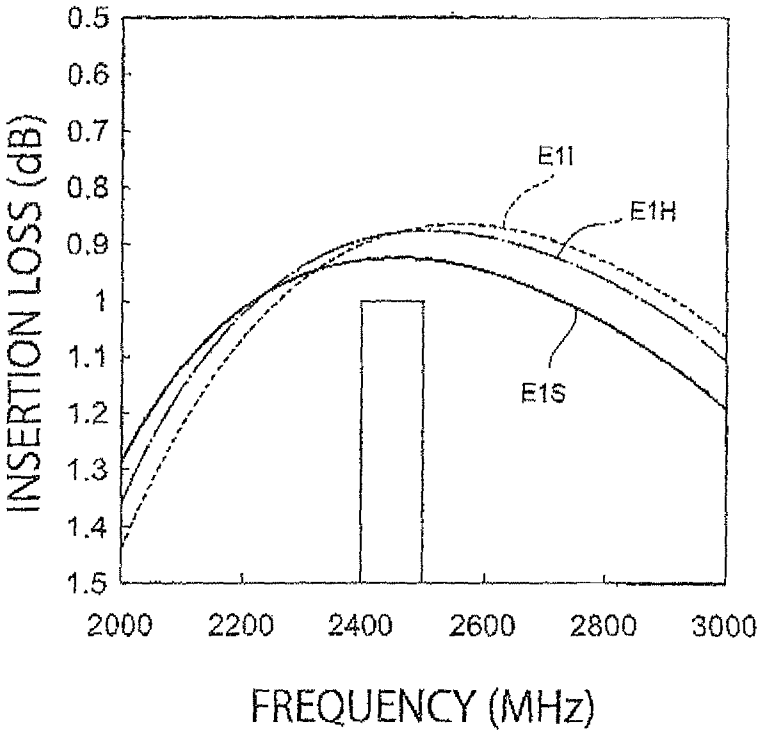
FIG. 31 is a graph showing insertion loss characteristic evaluation results.
Figure 32:
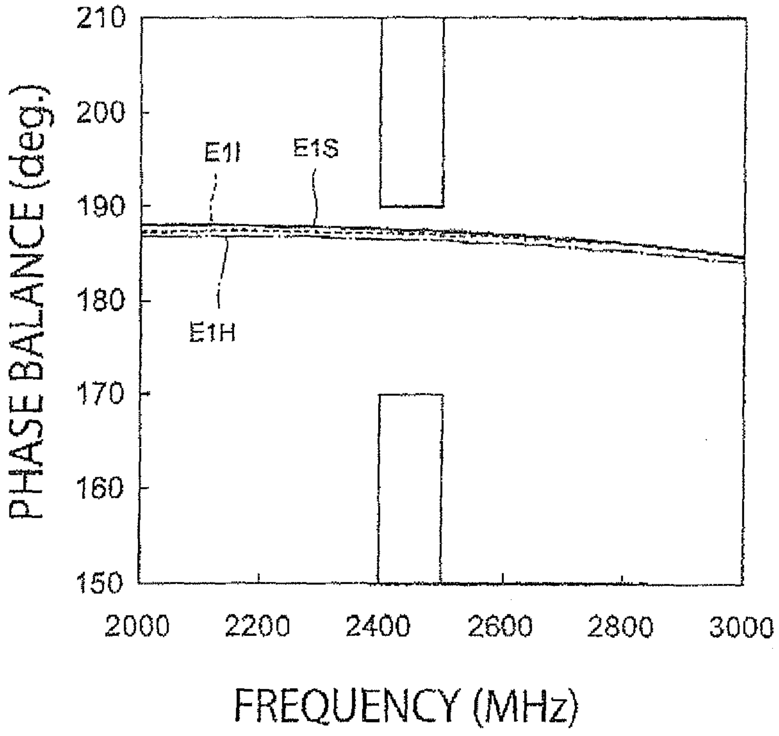
FIG. 32 is a graph showing phase balance characteristic evaluation results.
Figure 33:
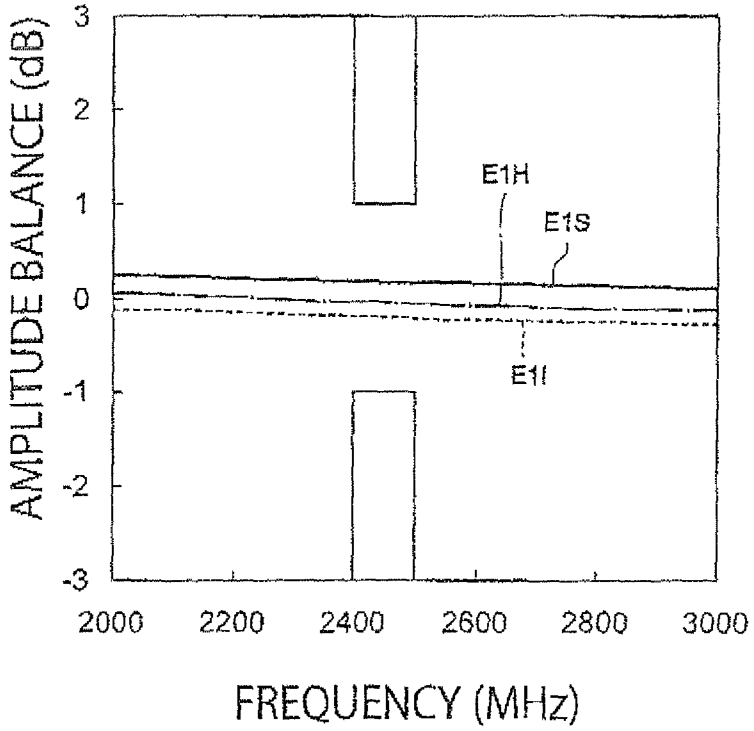
FIG. 33 is a graph showing amplitude balance characteristic evaluation results.
Figure 34:
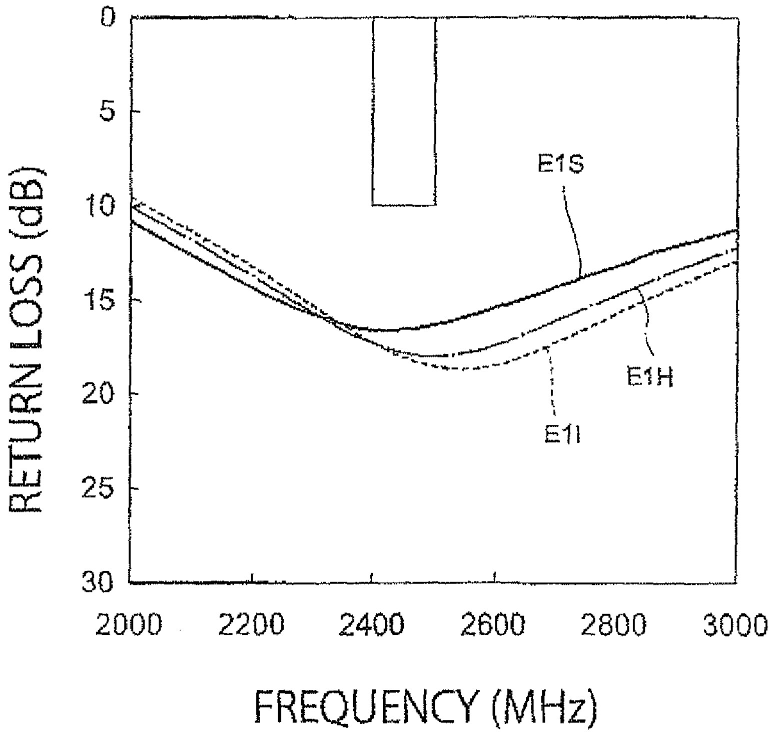
FIG. 34 is a graph showing return loss characteristic evaluation results.

The insertion loss characteristics, phase balance characteristics, amplitude balance characteristics and return loss characteristics of each of the thin film baluns 1H and 1I described above were determined by simulation. The evaluation target frequencies of the transmission signal were set at 2400 MHz to 2500 MHz. FIG. 31 is a graph showing insertion loss characteristic evaluation results, FIG. 32 is a graph showing phase balance characteristic evaluation results, FIG. 33 is a graph showing amplitude balance characteristic evaluation result, and FIG. 34 is a graph showing return loss characteristic evaluation result. In each drawing, each of the curves E1H, E1I and E1S shows the evaluation results of the thin film baluns 1H, 1I and 1S.

These results demonstrate that, compared to the thin film balun 1S of Reference Example 2, the thin film baluns 1H and 1I of each of the examples has excellent improvements. In particular, the insertion loss characteristics in Examples 8 and 9 were better than Reference Example 2. Although the degree of improvement in the phase balance characteristics is smaller in Example 9 than in Examples 8 due to the influence of a high-frequency shift of the center frequency, Examples 8 and 9 showed better results than Reference Example 2. Regarding the amplitude balance characteristics, Example 8 showed better results, and although Example 9 had substantially the same results as those of Reference Example 2 when comparing the difference from 0 dB, by improving the structure of the GND line from these results, it has been suggested that a suitable amplitude balance characteristic can be attained. Regarding the return loss characteristic, Examples 8 and 9 both showed better results than Reference Example 2. Accordingly, it can be understood that electrical characteristics can be improved also for thin film baluns 1H and 1I of Examples 8 and 9.

In Examples 8 and 9, a wiring that connects the coil portions C3 and C4 is formed to weaken the magnetic field of the balanced transmission line, i.e. to increase the L component, more than Examples 6 and 7. Thus, as can be seen from the insertion loss characteristics shown in FIG. 31 and return loss characteristics shown in FIG. 34, the high-frequency shift of the center frequency is relatively large. Therefore, the improvements in electrical characteristics of the thin film baluns 1H and 1I of Examples 8 and 9 are considered to be greater than those of the thin film baluns 1F and 1G of Examples 6 and 7.

For Examples 8 and 9, it has been found that while the degree of improvement in insertion loss characteristics, amplitude balance characteristics and return loss characteristics were greater than the degree of improvement of Examples 6 and 7, the degree of improvement in phase balance characteristics was smaller. It is considered that this was caused by allowing the wirings 32C and 32D that function to weaken the magnetic field of the balanced transmission line to extend to the openings of the coil conductors where the magnetic field is more concentrated, thereby causing the degree of influence on the electromagnetic coupling to be greater and thus the degree of influence on the characteristic impedance to be greater. Therefore, while the insertion loss characteristics, amplitude balance characteristics, etc. were more improved, the act of extending the wirings 32C and 32D of the coil portions C3 and C4 to an area over the openings of the coil conductors caused an effect for counteracting the magnetic field of the balanced transmission line to be stronger and brought counteraction to the line lengthy, thereby shortening the line length that contributes to the substantial electromagnetic coupling and decreasing the width improvement of the phase balance characteristics.

Example 10

Figure 35:
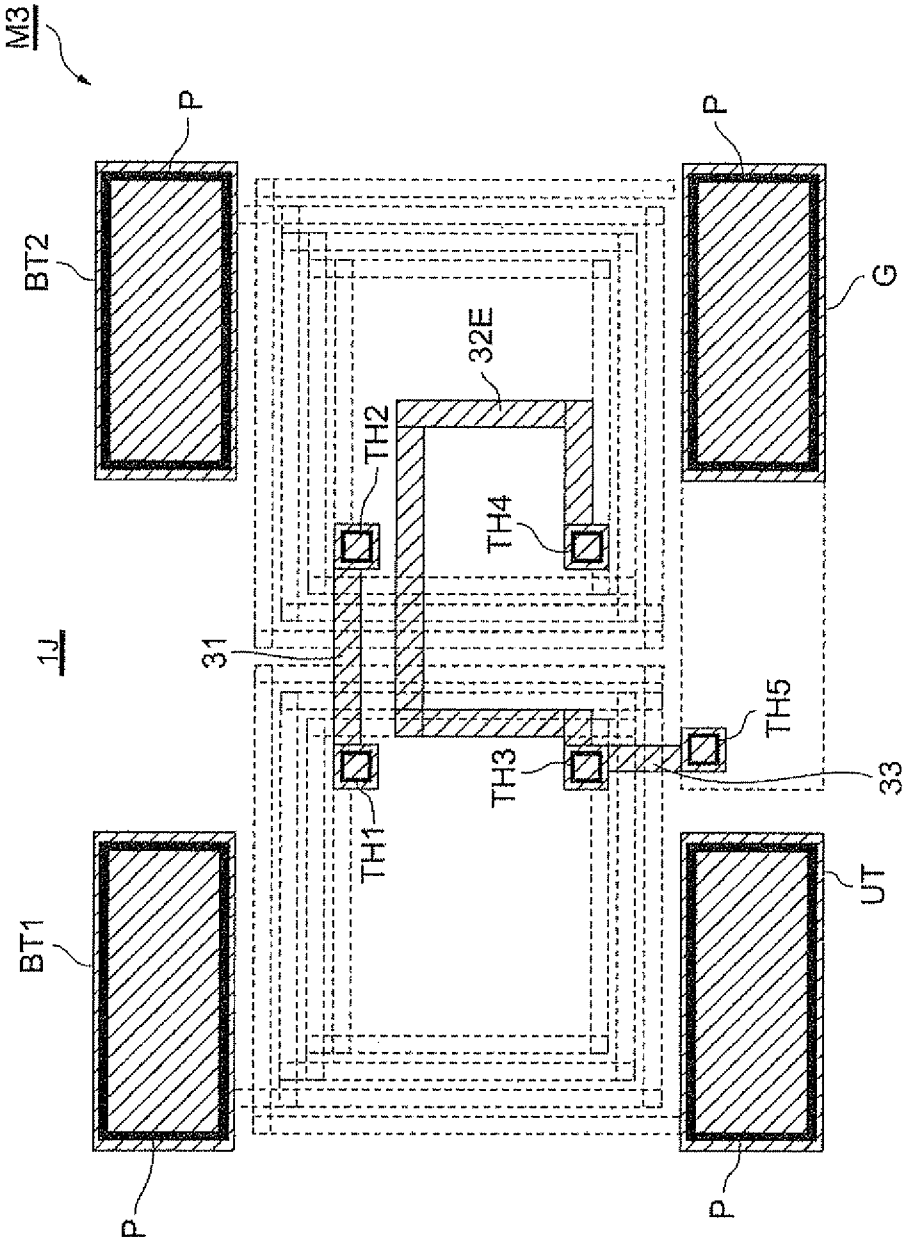
FIG. 35 is a horizontal sectional view in a wiring layer M3 of a thin film balun 1J of Example 10.

FIG. 35 is a horizontal sectional view schematically showing the wiring layer M3 in the thin film balun 1J of Example 10 of the present invention. The configuration other than that of the wiring layer M3 is the same as Example 8. As shown in FIG. 35, in the thin film balun 1J, in contrast to the structure of the thin film balun 1I of Example 9 described above, the wiring 32E that connects the coil portions C3 and C4 is positioned only at an area facing the opening of the coil conductor of the coil portion C4. Specifically, the wiring 32E extends from the through hole TH3 to an area near the through hole TH1, extends from an area near the through hole TH1 to an area near the through hole TH2, and extends from an area near the through hole TH2 to the through hole TH4 in a manner bypassing over and at the center the opening of the coil conductor of the coil portion C4.

Characteristic Evaluation 5

Figure 36:
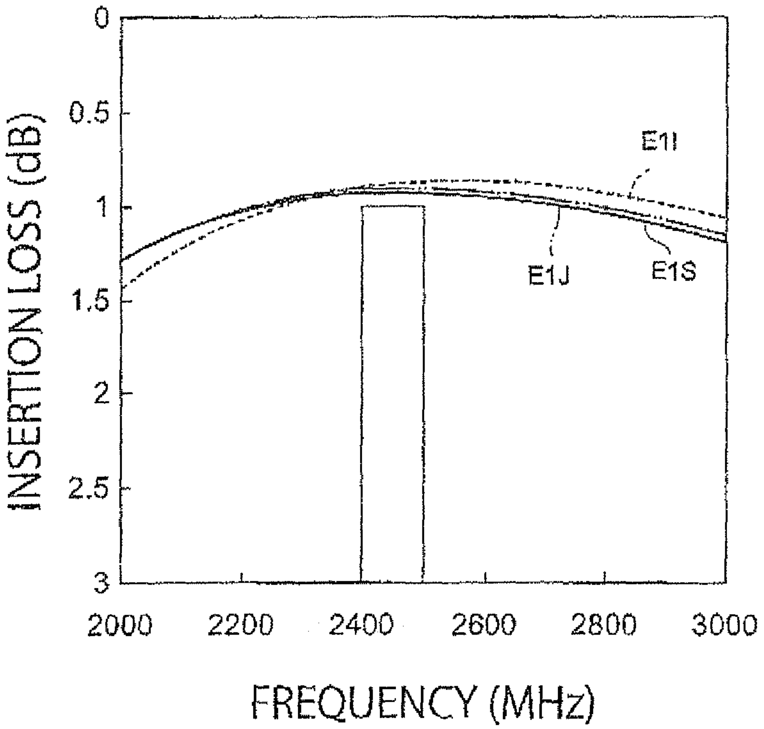
FIG. 36 is a graph showing insertion loss characteristic evaluation results.
Figure 37:
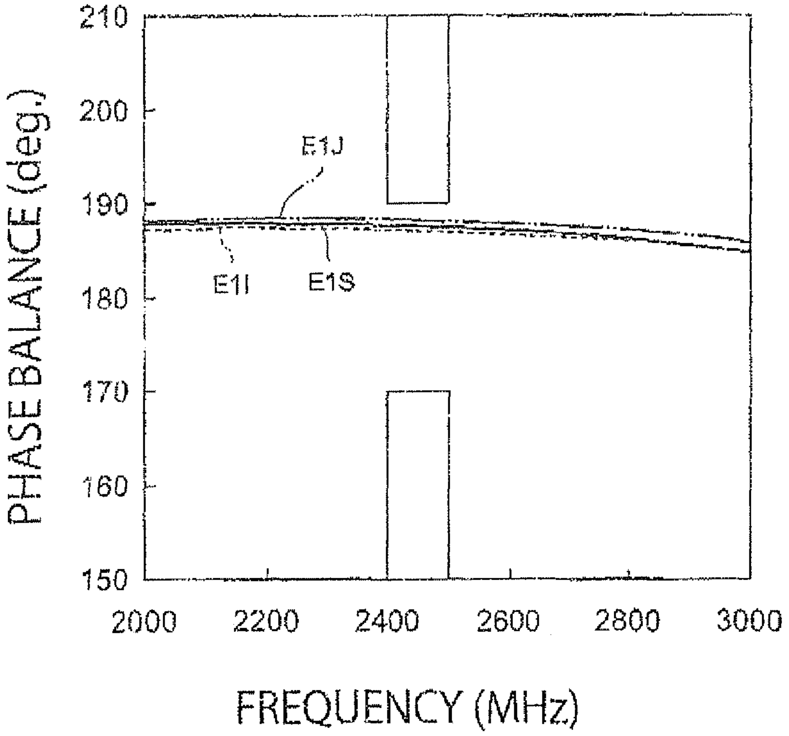
FIG. 37 is a graph showing phase balance characteristic evaluation results.
Figure 38:
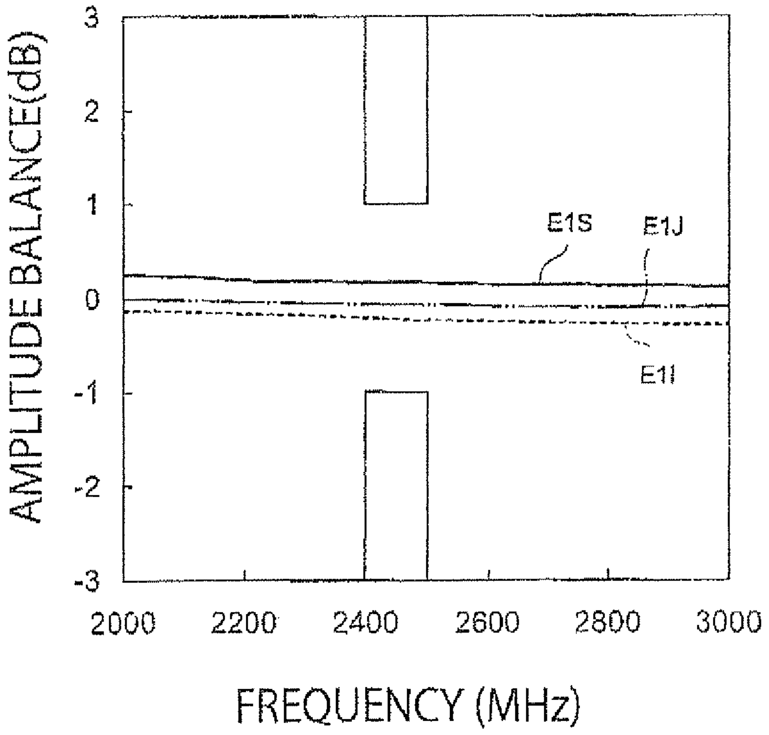
FIG. 38 is a graph showing amplitude balance characteristic evaluation results.
Figure 39:
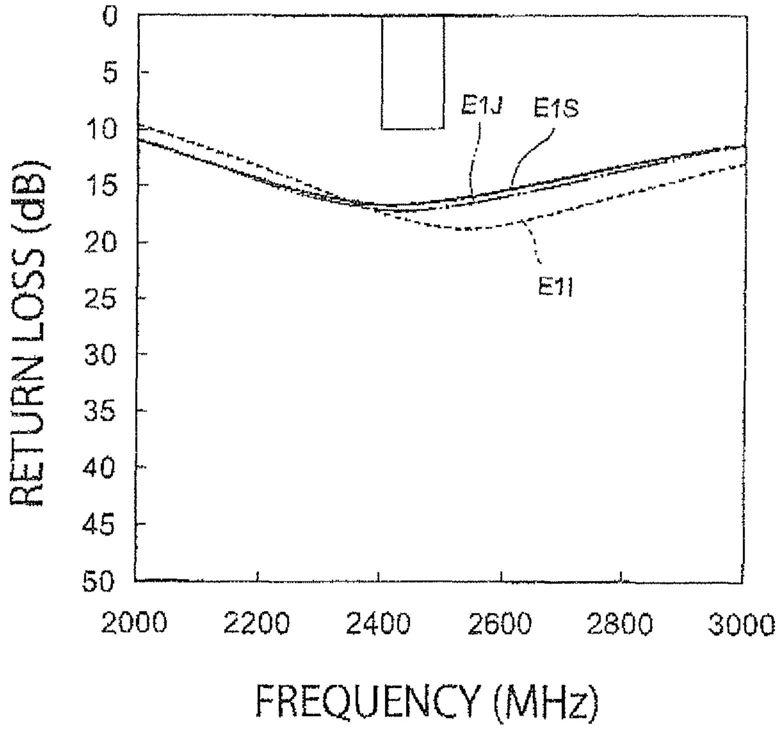
FIG. 39 is graph showing return loss characteristic evaluation results.

In order to compare the thin film balun 1J with the thin film baluns 1I and 1S described above, insertion loss characteristics, phase balance characteristics, amplitude balance characteristics and return loss characteristics of the thin film baluns 1J were determined by simulation. Evaluation target frequencies of a transmission signal were set at 2400 MHz to 2500 MHz, FIG. 36 is a graph showing insertion loss characteristic evaluation results, FIG. 37 is a graph showing phase balance characteristic evaluation results, FIG. 38 is a graph showing amplitude balance characteristic evaluation result, and FIG. 39 is a graph showing return loss characteristic evaluation results. In each drawing, each of the curves E1I, E1J and E1S show the evaluation results of the thin film baluns 1I, 1J and 1S.

These results demonstrate that, compared to the thin film balun 1S of Reference Example 2, the thin film balun 1J of Example 10 has greater improvements in insertion loss characteristics, phase balance characteristics and return loss characteristics. However, it has been found that when compared to the thin film balun 1I of Example 9, the degree of improvement in the insertion loss characteristics, amplitude balance characteristics and return loss characteristics were small. Accordingly, it has been found that even though there is an improvement, even if the wiring 32 E (L component) that connects the coil portions C3 and C4 is positioned at an area facing only the opening of the coil conductor of coil portion C4, it is preferable that the L component is positioned at areas facing the openings of the coil conductors of both the coil portions C3 and C4.

Modification Example

As noted earlier, the present invention is not limited to the above embodiments and examples, and various changes can be made without changing its content. For example, in Example 2, although an example in which the GND electrode 40B is formed at a position excluding the areas facing coil portions C3 and C4 that constitute the balanced transmission line BL has been described, the GND electrode may be formed at a position excluding an area facing at least one the coil portions C1 and C2 that constitute the unbalanced transmission line UL and the coil portions C3 and C4 that constitute the balanced transmission line BL. Moreover, the arrangement of the unbalanced terminal UT, the balanced terminals BT1 and BT2, and the ground terminal G is not limited to the positions shown in the drawings. The multilayer wiring structure that constitutes the thin film balun may have more or less layers than shown in the drawings. In addition, the structure may have the wiring layers on the insulating substrate 100 in reversed order.

Furthermore, various coil arrangements may be employed without departing from the scope of the present invention. For example, as long as the wiring of the coil portions C3 and C4 is functioned to weaken the magnetic field of the balanced transmission line, it may be circular, elliptical, or even hexagonal. The GND line 33 is not limited to the connection between the wiring 32 (L component) and the coil portion C3 as in each of the embodiments described above, and it may be, for example, a connection between the wiring 32 (L component) and the coil portion C4.

As described above, the thin film balun of the present invention can realize a thin film balun with improved balanced characteristics while maintaining miniaturization. Thus, such a thin film balun is widely applicable, in particular to wireless communication devices which are required to be smaller.

What is claimed is:

1. A thin film balun comprising:

an unbalanced transmission line including a first line portion and a second line portion;

a balanced transmission line including a third line portion and a fourth line portion that are positioned facing the first line portion and the second line portion and magnetically coupled to the first line portion and the second line portion, respectively;

an unbalanced terminal connected to an end of the first line portion;

a first balanced terminal connected to the third line portion;

a second balanced terminal connected to the fourth line portion; and a ground terminal connected to the third line portion and the fourth line portion, wherein:

the ground terminal has an extension that extends from the ground terminal to an area at the unbalanced terminal side;

the third line portion and the fourth line portion are formed in a first layer; and a connection electrically connecting the third line portion and the fourth line portion and the extension connected to the connection are formed in a second layer.

2. The thin film balun according to claim 1, wherein the extension is formed at an area excluding an area facing at least one of the unbalanced transmission line and the balanced transmission line.

3. The thin film balun according to claim 1, wherein the connection and the extension are connected to each other by a lead conductor, the lead conductor being positioned closer to the unbalanced terminal than the ground terminal.

4. The thin film balun according to claim 1, wherein the extension is formed in a layer that is the same as at least one of a layer in which the third line portion and the fourth line portion are formed and a layer in which the first line portion and the second line portion are formed.

5. The thin film balun according to claim 1, wherein the connection electrically connecting the third line portion and the fourth line portion is an L component.

6. The thin film balun according to claim 5, wherein each of the line portions is formed by a coil.

7. The thin film balun according to claim 6, wherein at least a part of the L component is positioned at an area facing an opening of a coil conductor of at least one of the third line portion and the fourth line portion.

8. The thin film balun according to claim 6, wherein the L component is positioned between the ground terminal and the fourth line portion.

* * * * *